United States Patent [19]

Momose et al.

[11] Patent Number: 5,247,200
[45] Date of Patent: Sep. 21, 1993

[54] MOSFET INPUT TYPE BIMOS IC DEVICE

[75] Inventors: Hiroshi Momose, Tokyo; Kouji Makita, Hamamatsu, both of Japan

[73] Assignee: Kabushiki Kaisha Toshiba, Kawasaki, Japan

[21] Appl. No.: 764,091

[22] Filed: Sep. 23, 1991

Related U.S. Application Data

[63] Continuation of Ser. No. 480,941, Feb. 16, 1990, abandoned.

[30] Foreign Application Priority Data

Feb. 16, 1989 [JP] Japan .................. 1-36486

[51] Int. Cl.⁵ .............. H01L 27/02; H01L 27/01; H01L 29/72
[52] U.S. Cl. .................. 257/378; 257/370; 257/371; 257/379; 257/395; 257/401; 257/565; 257/577; 257/653; 257/655
[58] Field of Search .............. 357/43, 35, 42; 257/370, 371, 378, 379, 395, 401, 565, 577, 653, 655

[56] References Cited

U.S. PATENT DOCUMENTS

| | | | |
|---|---|---|---|
| 4,066,917 | 1/1978 | Compton et al. | 307/304 |
| 4,217,688 | 8/1980 | Ipri | 357/43 |
| 4,244,001 | 1/1981 | Ipri | 357/43 |
| 4,729,007 | 3/1988 | Coe | 357/43 |
| 4,825,274 | 4/1989 | Higuchi et al. | 357/43 |
| 4,901,131 | 2/1990 | Takahashi | 357/43 |
| 4,928,164 | 5/1990 | Tanizawa | 357/43 |
| 4,931,407 | 6/1990 | Maeda et al. | 437/45 |
| 4,935,800 | 6/1990 | Taguchi | 357/43 |
| 5,117,274 | 5/1992 | Mastroianni | 357/43 |

FOREIGN PATENT DOCUMENTS

| | | |
|---|---|---|
| 0253353A2 | 1/1988 | European Pat. Off. . |
| 56-101770 | 8/1981 | Japan . |
| 59-087866 | 5/1984 | Japan .................. 357/43 |
| 59-121969 | 7/1984 | Japan .................. 357/43 |
| 62-069661 | 3/1987 | Japan .................. 357/43 |
| 62-150760 | 7/1987 | Japan . |
| 62-169466 | 7/1987 | Japan . |
| WO85/04285 | 9/1985 | PCT Int'l Appl. . |

OTHER PUBLICATIONS

T. Tanaka, Y. Yasuda, M. Ohayashi, M. Okamura, "A New MOS-Gate Bipolar Transistor With Fast Switching Speed and High Current Capability", 2419 Japanese Journal of Applied Physics Supplements, 17th Conf. on Solid State Devices and Materials, Aug. 25–27, 1985, Tokyo, Japan, pp. 389–392.

Primary Examiner—Andrew J. James
Assistant Examiner—Ngan Van Ngo
Attorney, Agent, or Firm—Banner, Birch, McKie & Beckett

[57] ABSTRACT

A BiMOS integrated circuit device comprises a bipolar transistor and at least one MOSFET. The collector and emitter of the bipolar transistor are connected to a high potential source and a low potential source, respectively. The MOSFET has two gate electrodes, a source, and a drain. The source is connected to the high potential source, and the drain is the base of the bipolar transistor by a diffusion layer. The diffusion layer is located between the gate electrodes, and serves as both the base of the bipolar transistor and the drain of the MOSFET. Therefore, the MOSFET has a great channel width, and a large current can be supplied to the base of the bipolar transistor. In other words, the MOSFET has a great driving capability, and the bipolar transistor has a high amplification factor.

25 Claims, 19 Drawing Sheets

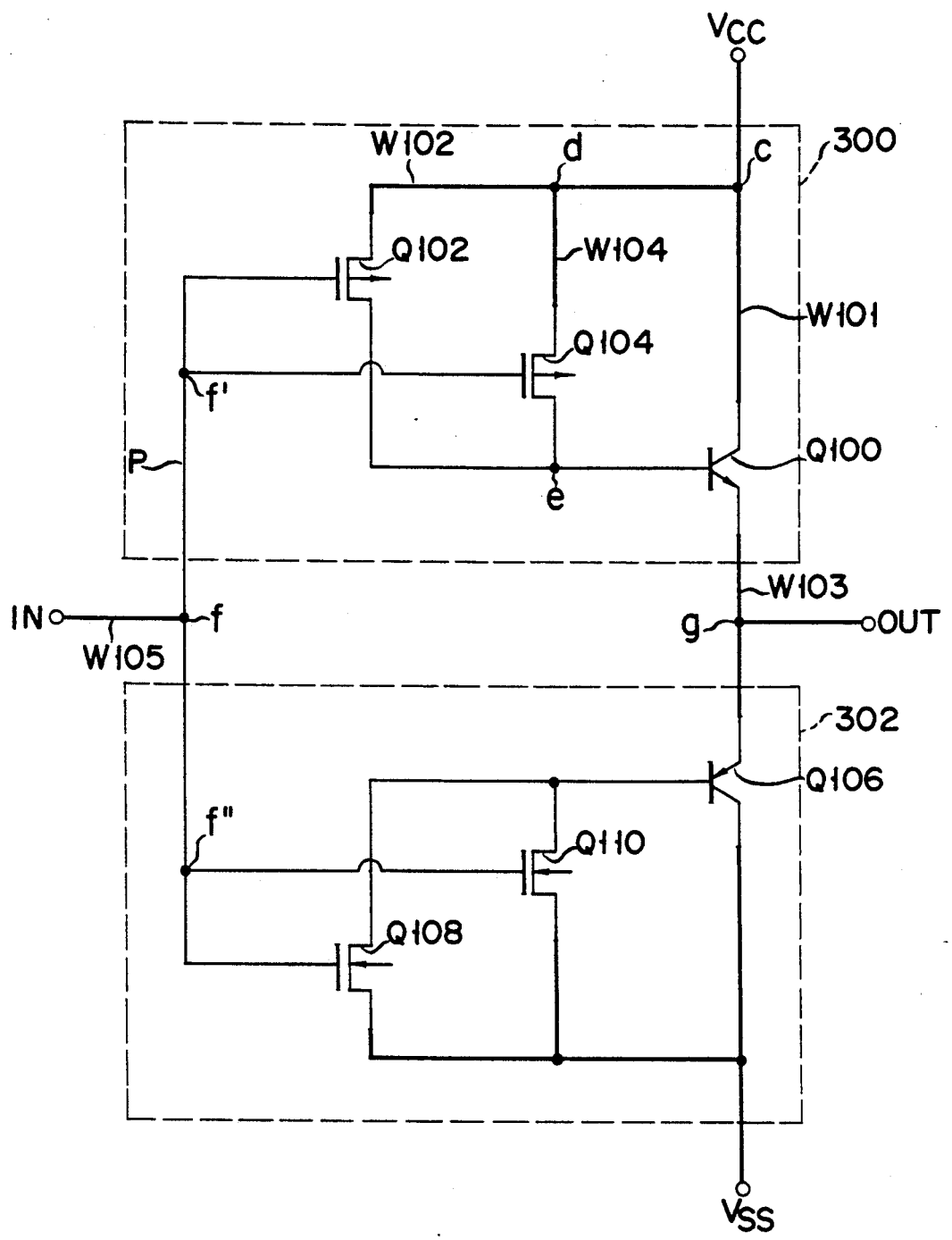
F I G. 5

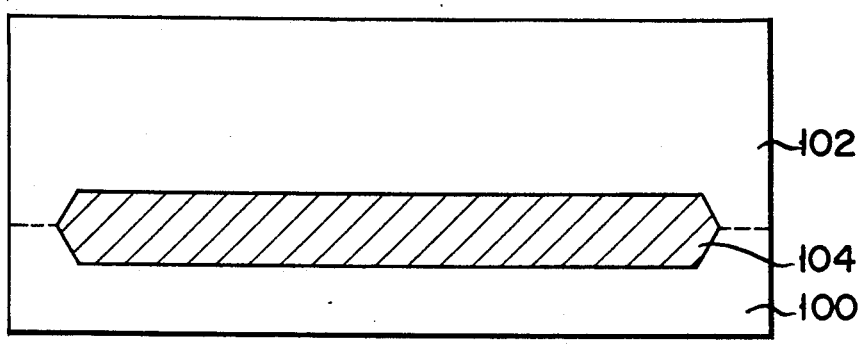
F I G. 8A
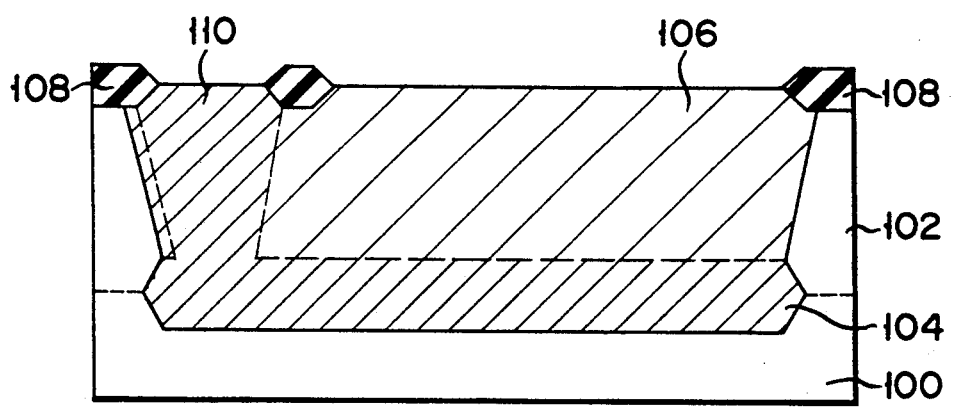
F I G. 8B

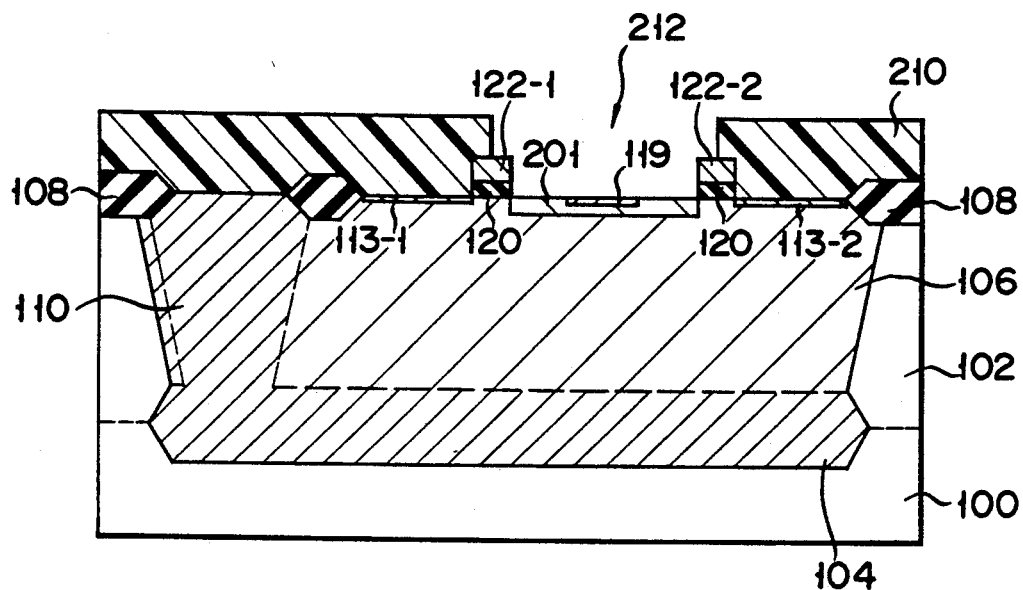
F I G. 8G
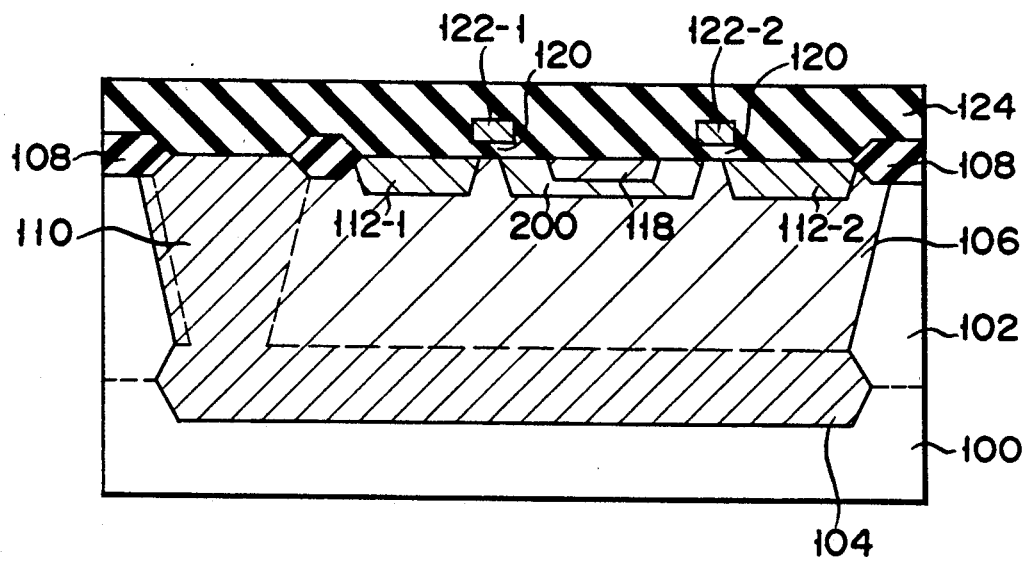
F I G. 8H

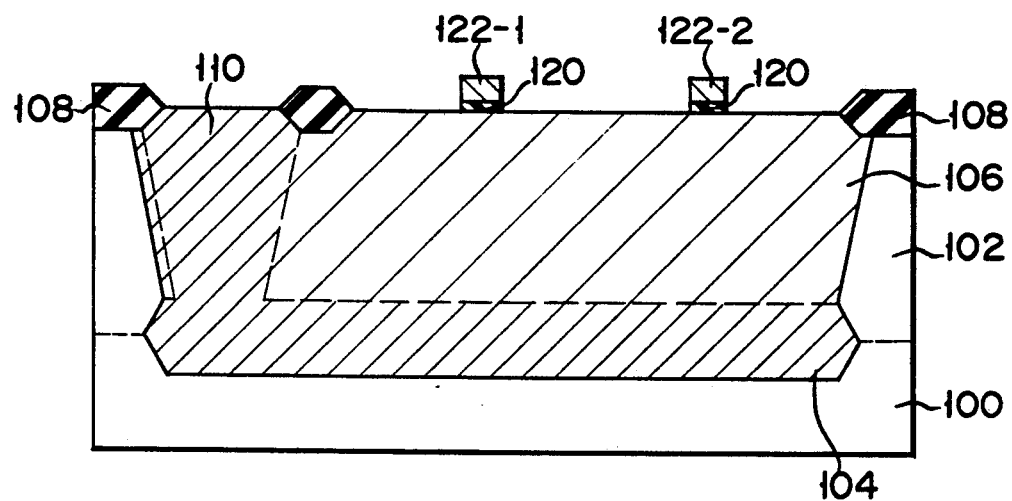
F I G. 9A
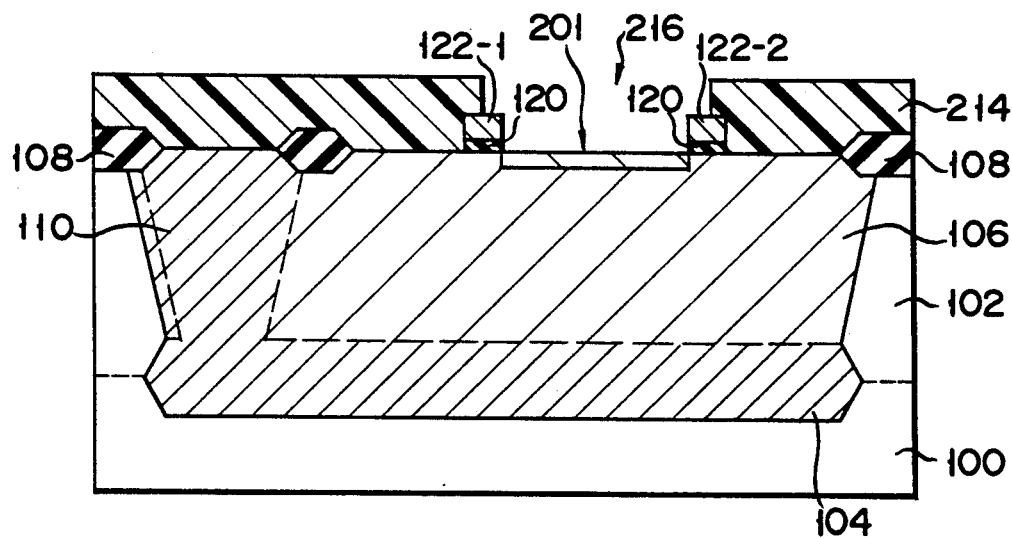
F I G. 9B

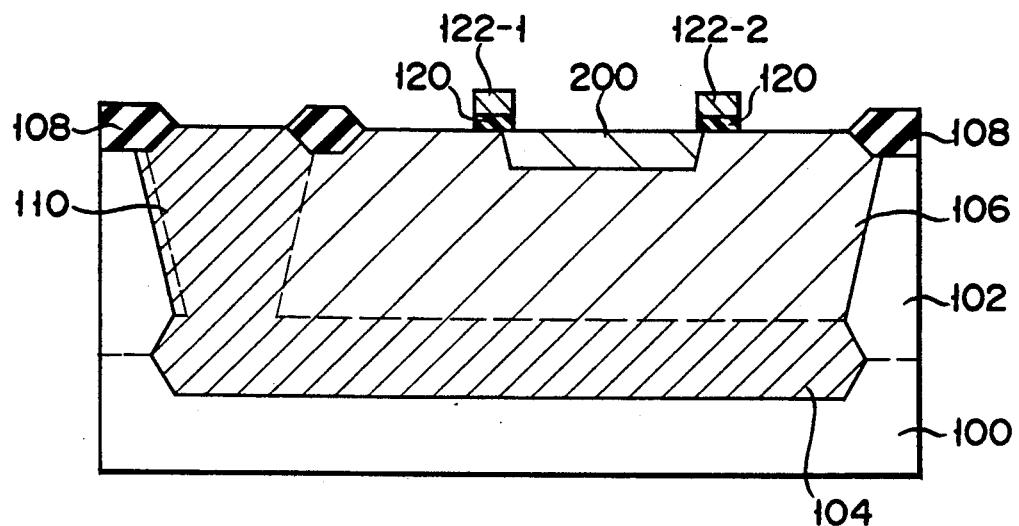
F I G. 9C
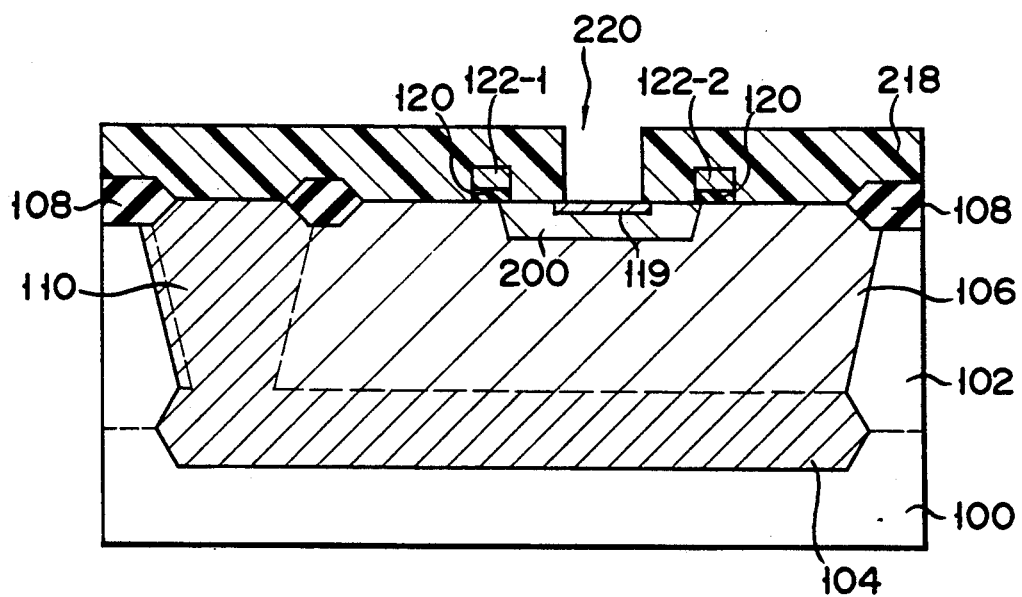
F I G. 9D

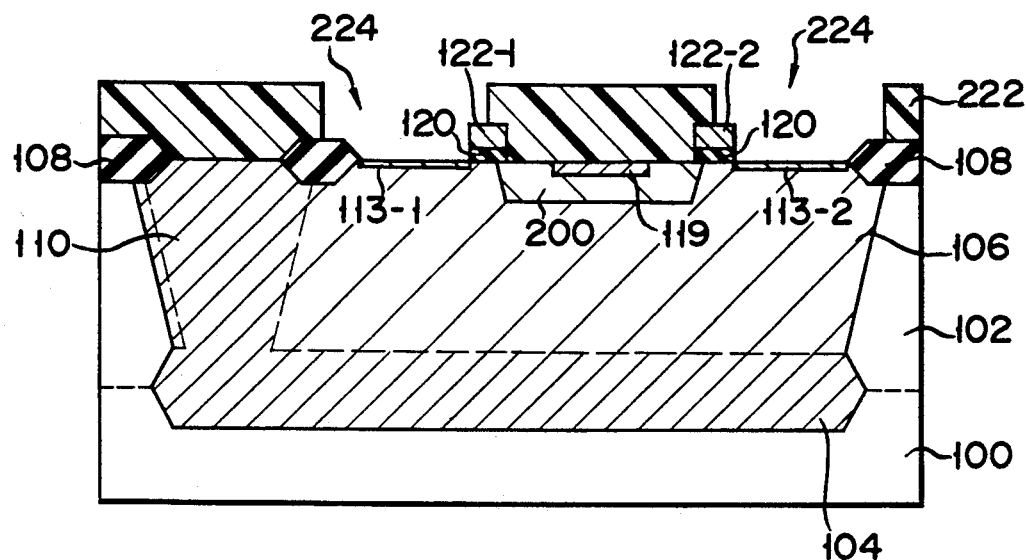
F I G. 9E
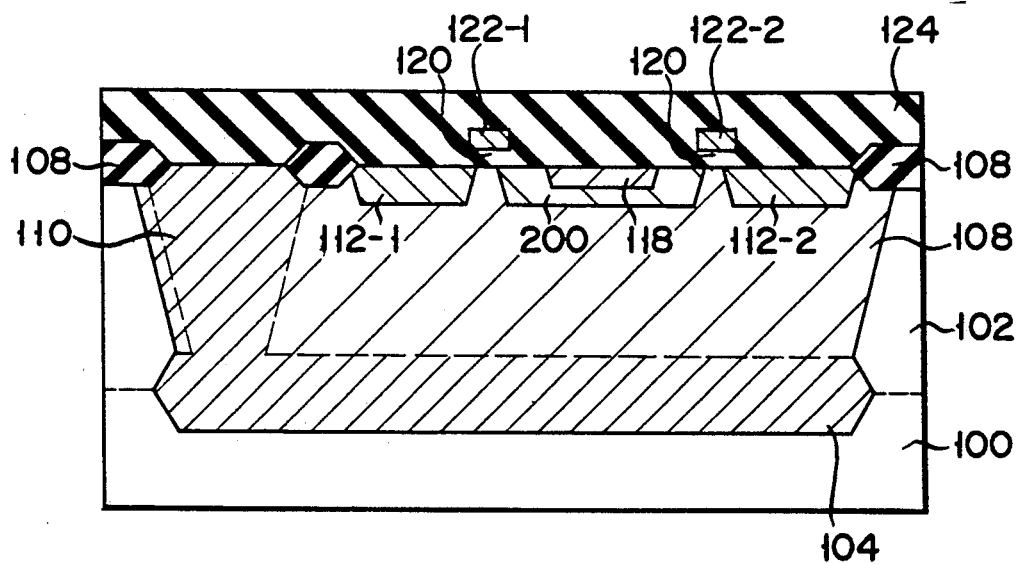
F I G. 9F

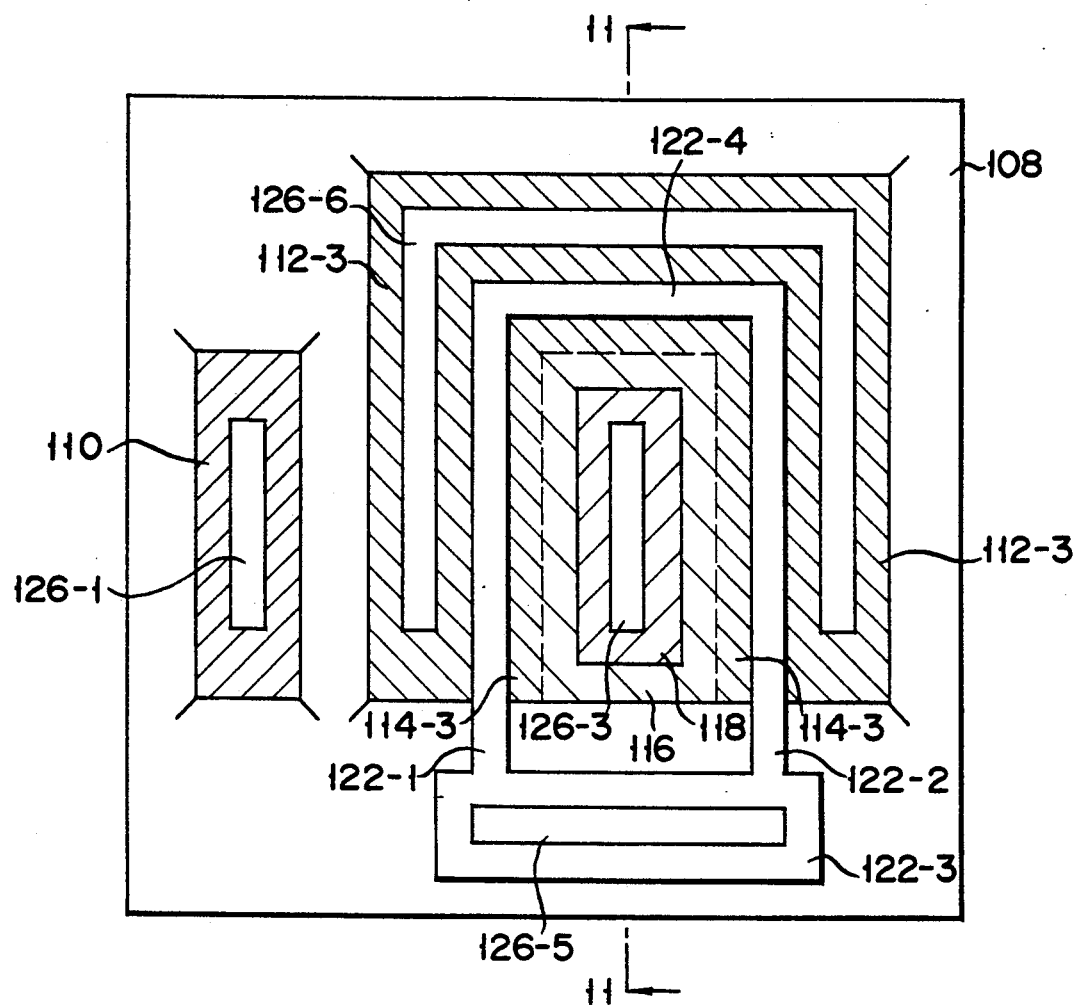
F I G. 10
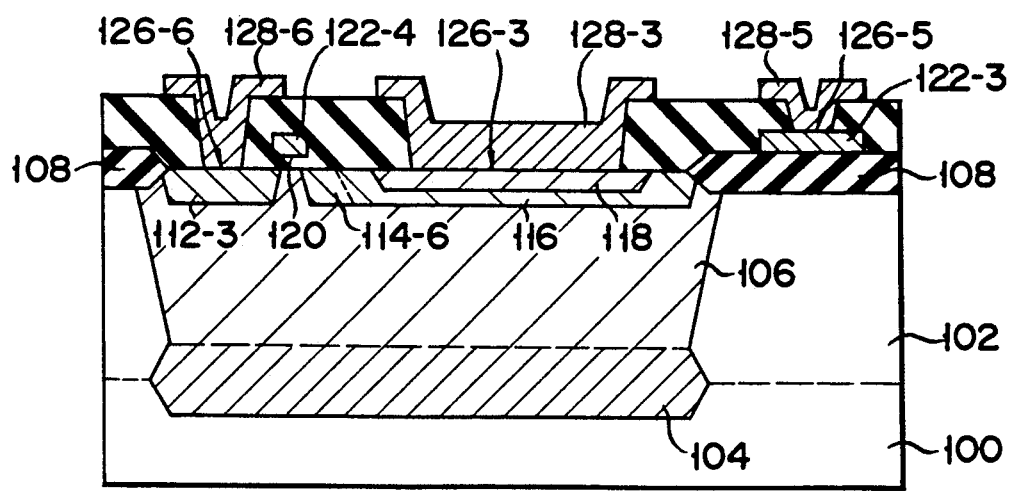
F I G. 11

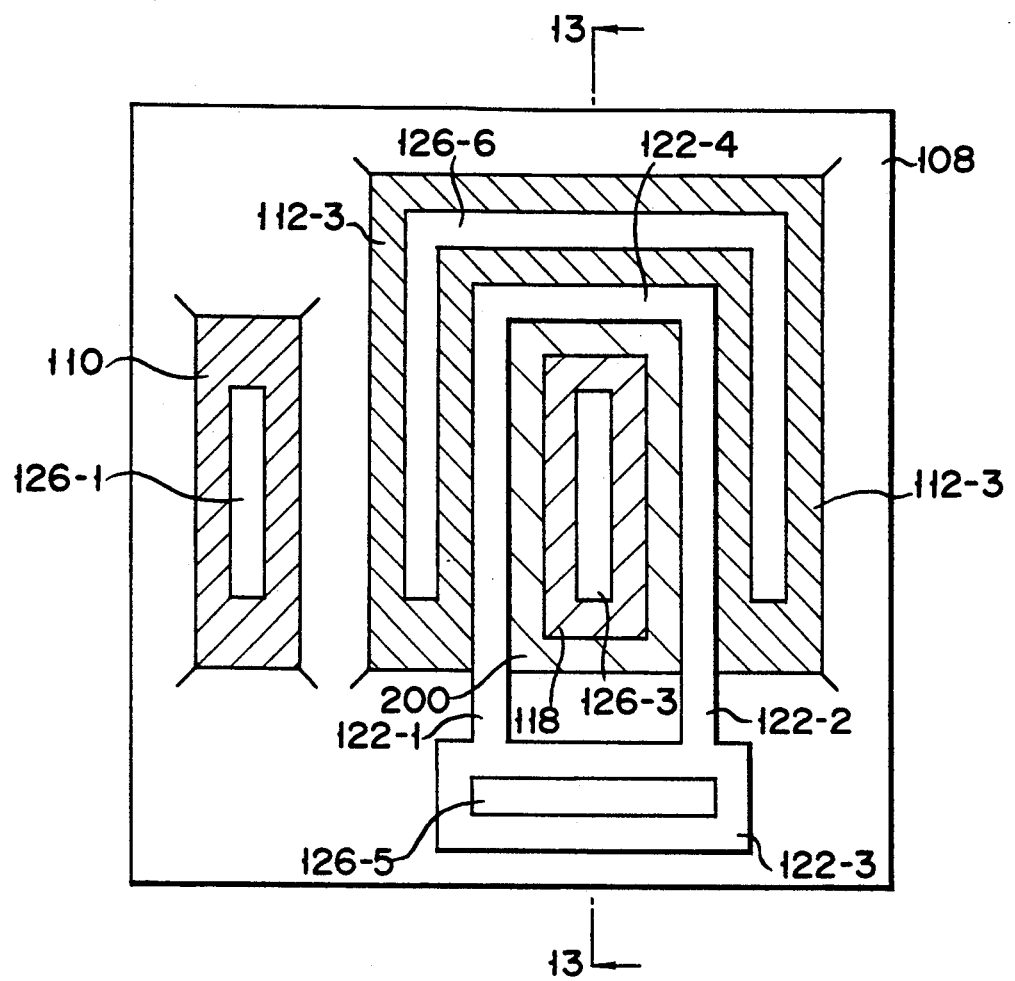
F I G. 12
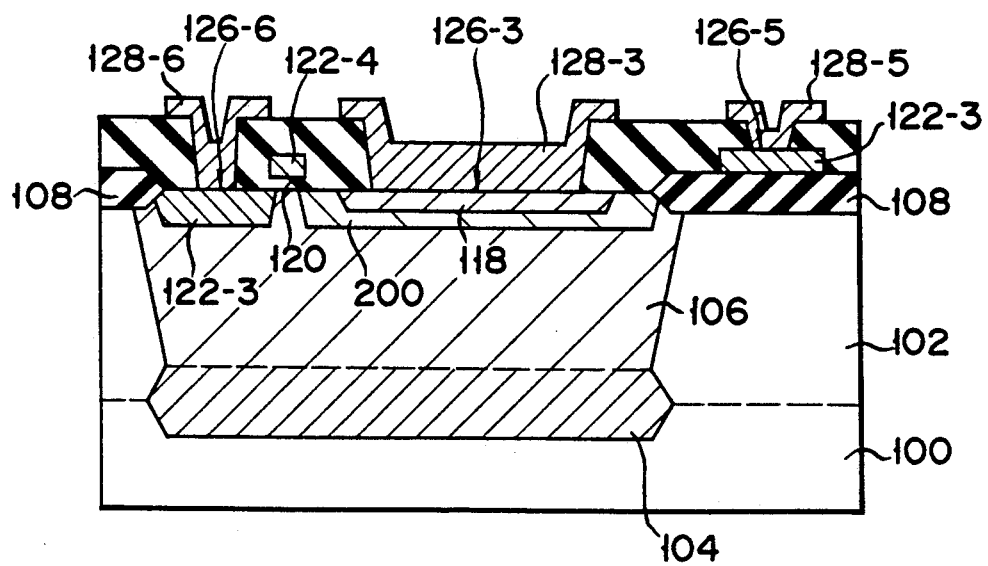
F I G. 13

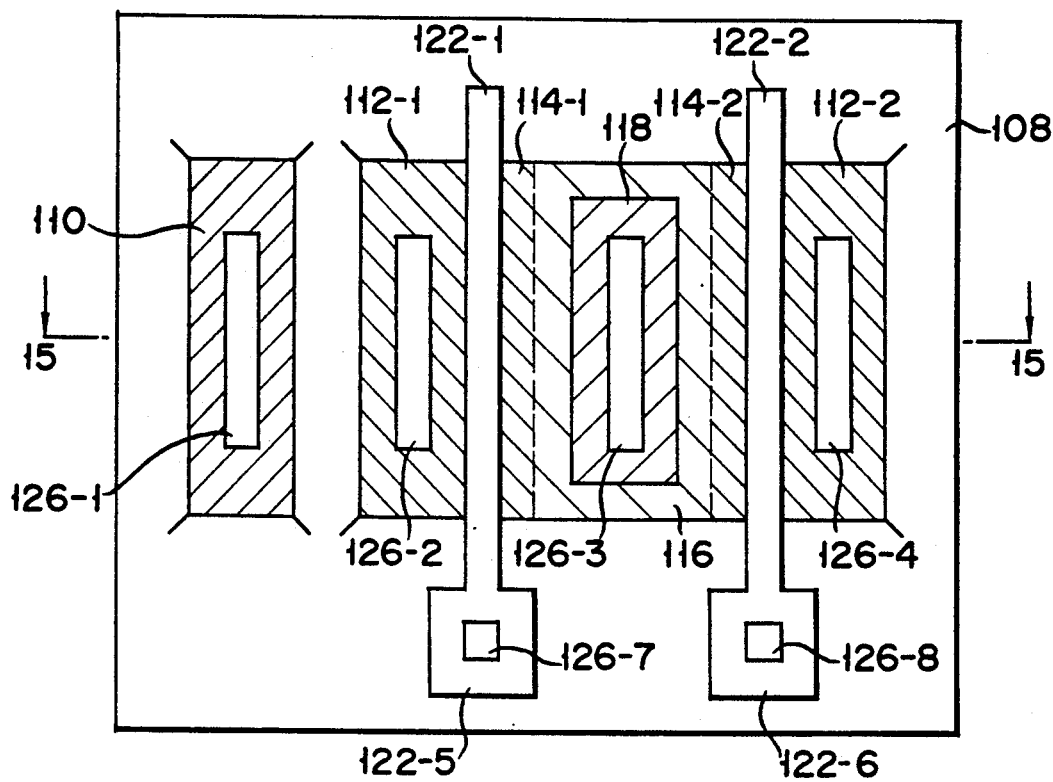
F I G. 14
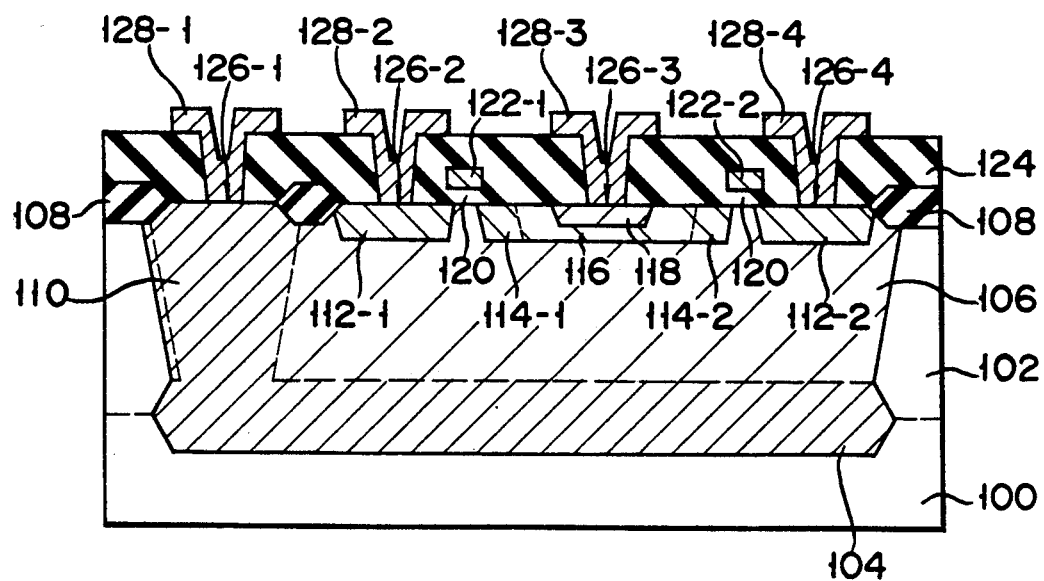
F I G. 15

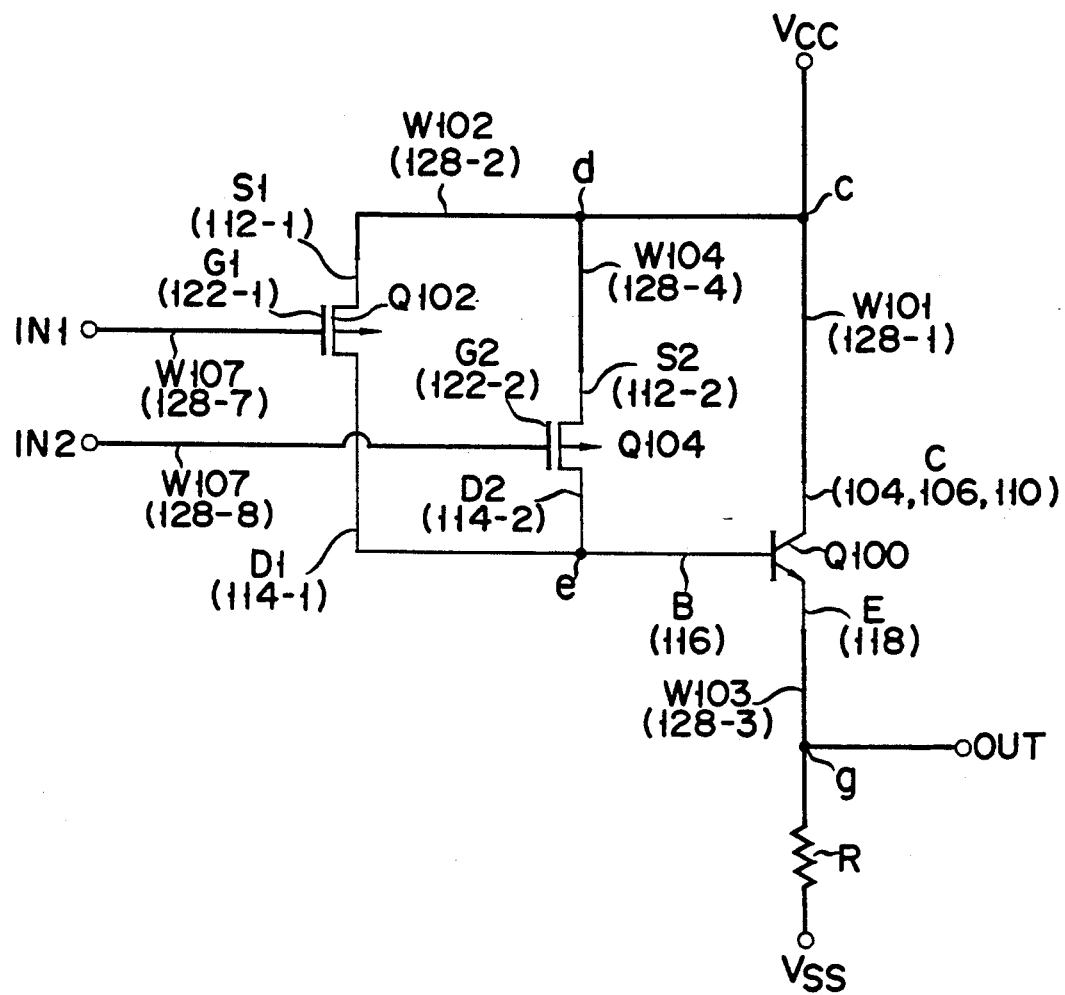
F I G. 16

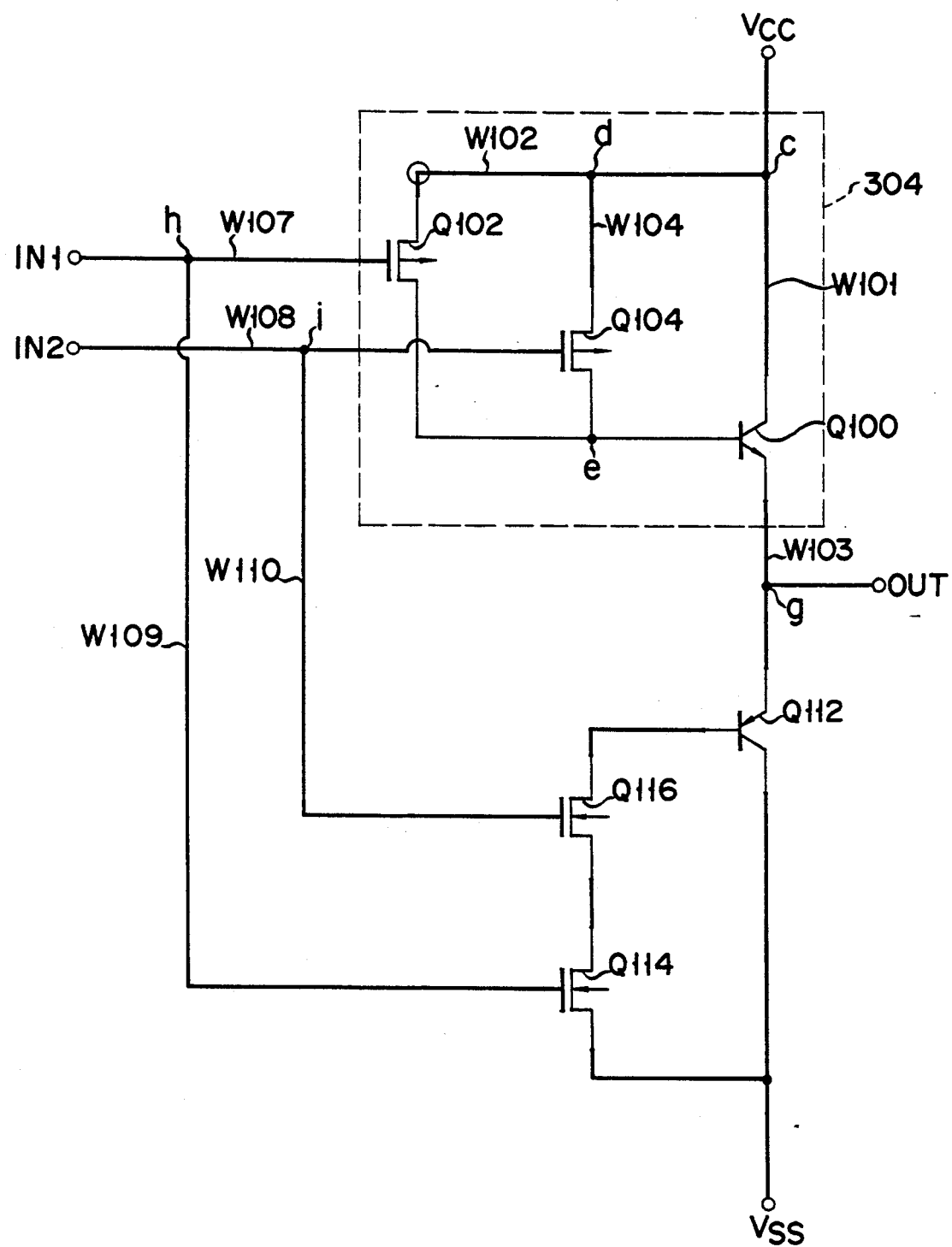
F I G. 17

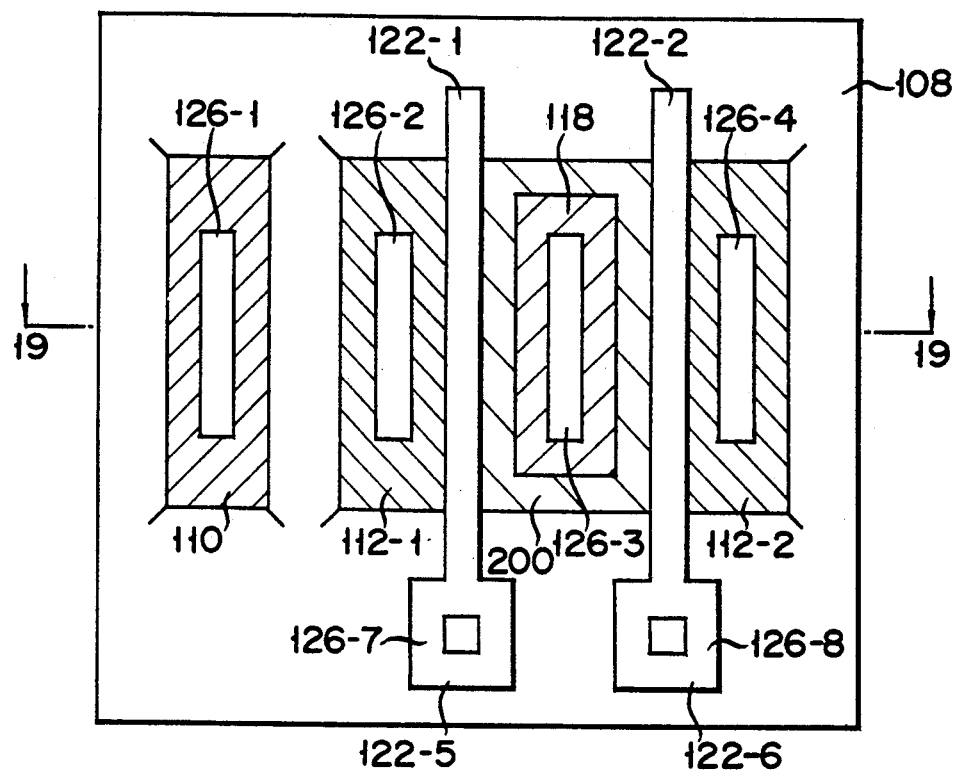
F I G. 18
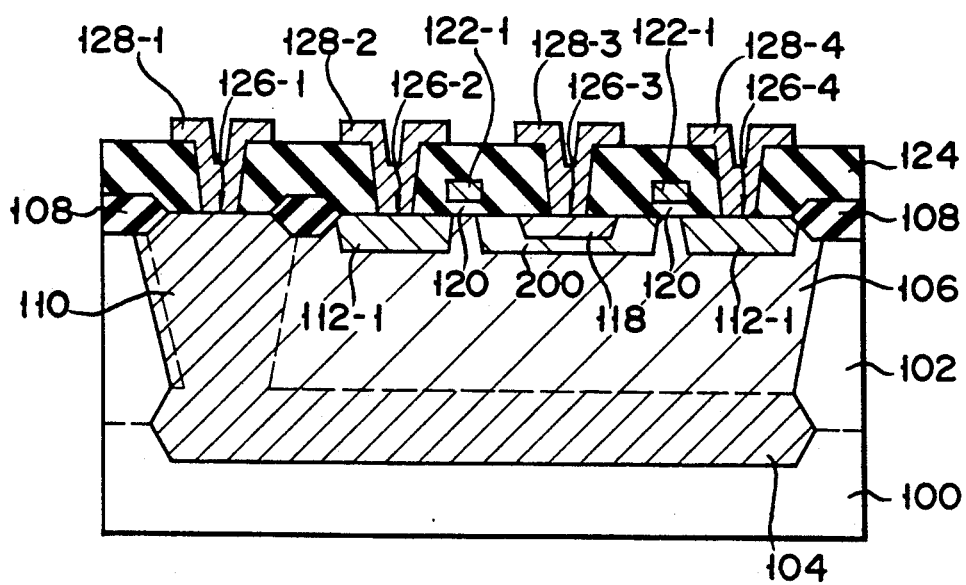
F I G. 19

MOSFET INPUT TYPE BIMOS IC DEVICE

This application is a continuation of application Ser. No. 07/480,941, filed Feb. 16, 1990 now abandoned.

BACKGROUND OF THE INVENTION

1. Field of the Invention

The present invention relates to a MOSFET input type BiMOS IC (Bipolar - MOSFET Integrated circuit) device.

2. Description of the Related Art

The BiMOS is known in the art. FIG. 1 shows an arrangement of the integrated circuit of such a type as set forth below.

As shown in FIG. 1, the integrated circuit comprises an npn type bipolar transistor Q1 and a p channel MOSFET Q2, the interconnection of which is as follows.

The collector C of the bipolar transistor Q1 is connected to a high potential source Vcc via a metal wire W1. The emitter E of the bipolar transistor Q1 is connected to a load R via a metal wire W2. The load R is connected a low potential source Vss. The source S of MOSFET Q2 is connected via a metal wire W3 to a node a between a high potential source Vcc and the collector C of the bipolar transistor Q1. The drain D of MOSFET Q2 is connected via a metal wire W4 to the base B of the bipolar transistor Q1. An input signal IN to the integrated circuit is supplied to the gate G of MOSFET Q2 via a metal wire W5. An output signal OUT is output from the integrated circuit, that is, a node b which is present between the emitter E and the load R.

The aforementioned MOSFET input type BiMOS integrated circuit is higher in switching rate than a bipolar transistor input type Darlington integrated circuit. The reason is that the input stage of the former integrated circuit is composed of an FET.

However, the amplification factor of the FET input type BiMOS integrated circuit is poorer than that of the bipolar transistor input type Darlington integrated circuit.

SUMMARY OF THE INVENTION

One object of the present invention is to provide an FET input type BiMOS integrated circuit (IC) device of a greater amplification factor.

Another object of the present invention is to provide an two-input/one-output type BiMOS integrated circuit device advantageous to high integration density.

According to one aspect of the present invention, there is provided an FET input type BiMOS integrated circuit device comprising:

a semiconductor body of first conductivity type having a major surface;

a gate electrode composed of a first conductive member formed over the major surface of the semiconductor body and extending in a first direction, a second conductive member formed over the major surface of the semiconductor body and substantially parallel to the first conductive member, and a third conductive member connecting the first conductive member to the second conductive member;

a first semiconductor region of the second conductivity type formed in that portion of the semiconductor body which is situated between the second conductive member and the second conductive member, and exposed on the major surface of the semiconductor body;

a second semiconductor region of the first conductivity type formed in the first semiconductor region and exposed on the major surface of the semiconductor body;

a third semiconductor region of second conductivity type formed in the semiconductor body and situate opposite to the first semiconductor region with a semiconductor body portion left relative to the first conductive member and exposed on the major surface of the semiconductor body; an a fourth semiconductor region of the second conductivity type formed in the semiconductor body and situated opposite to the first semiconductor region with a semiconductor body portion left relative to the second conductive member and exposed on the major surface of the semiconductor body.

According to another aspect of the present invention, there is provided an FET two-input type BiMOS integrated circuit device comprising:

a semiconductor body of first conductivity type having a major surface;

a first gate electrode formed over a major surface of the semiconductor body and extending in a first direction;

a second gate electrode formed over the major surface of the semiconductor body and extending in a direction substantially parallel to that of the first gate electrode;

a first semiconductor region of second conductivity type formed at a location between the first and second gate electrodes and exposed on the major surface of the semiconductor body;

a second semiconductor region of the first conductivity type formed in the first semiconductor region and exposed on the major surface of the semiconductor body;

a third semiconductor region of second conductivity type formed in the semiconductor body, situated opposite to the first semiconductor region with a semiconductor body portion left relative to the first gate electrode, and exposed on the major surface of the semiconductor body; and a fourth semiconductor region of the second conductivity type formed in the semiconductor body portion left relative to the second gate electrode, and exposed on the major surface of the semiconductor body.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 shows an inverter circuit using a MOSFET input type BiMOS integrated circuit device having a structure of the first embodiment of the present invention;

FIGS. 8A to 8J are cross-sectional views showing the steps of manufacturing a MOSFET input type BiMOS integrated circuit device according to the present invention;

FIGS. 9A to 9F are cross-sectional views showing the steps of manufacturing another a MOSFET input type BiMOS integrated circuit device according to the present invention;

FIG. 10 is a plan view showing an arrangement of a MOSFET input type BiMOS integrated circuit device according to a third embodiment of the present invention;

FIG. 11 is a cross-sectional view as taken along line 11—11 in FIG. 10;

FIG. 12 is a plan view showing a MOSFET input type BiMOS integrated circuit device according to a fourth embodiment of the present invention;

FIG. 13 is a cross-sectional view as taken along line 13—13 in FIG. 12;

FIG. 14 is a plan view showing an arrangement of a MOSFET input type BiMOS integrated circuit device according to a fifth embodiment of the present invention;

FIG. 15 is a cross-sectional view as taken along line 15—15 in FIG. 14;

FIG. 16 is an equivalent circuit showing a MOSFET input type BiMOS integrated circuit device according to the fifth embodiment of the present invention;

FIG. 17 shows a NAND circuit using a MOSFET input type BiMOS integrated circuit device having a structure of the fifth embodiment of the present invention;

FIG. 18 is a plan view showing an arrangement showing a MOSFET input type BiMOS integrated circuit device of sixth embodiment; and FIG. 19 is a cross-sectional view as taken along line 19—19 in FIG. 18.

DETAILED DESCRIPTION OF THE PREFERRED EMBODIMENTS

The embodiments of the present invention will be explained below with reference to the drawings.

EMBODIMENT 1

Figure 2:
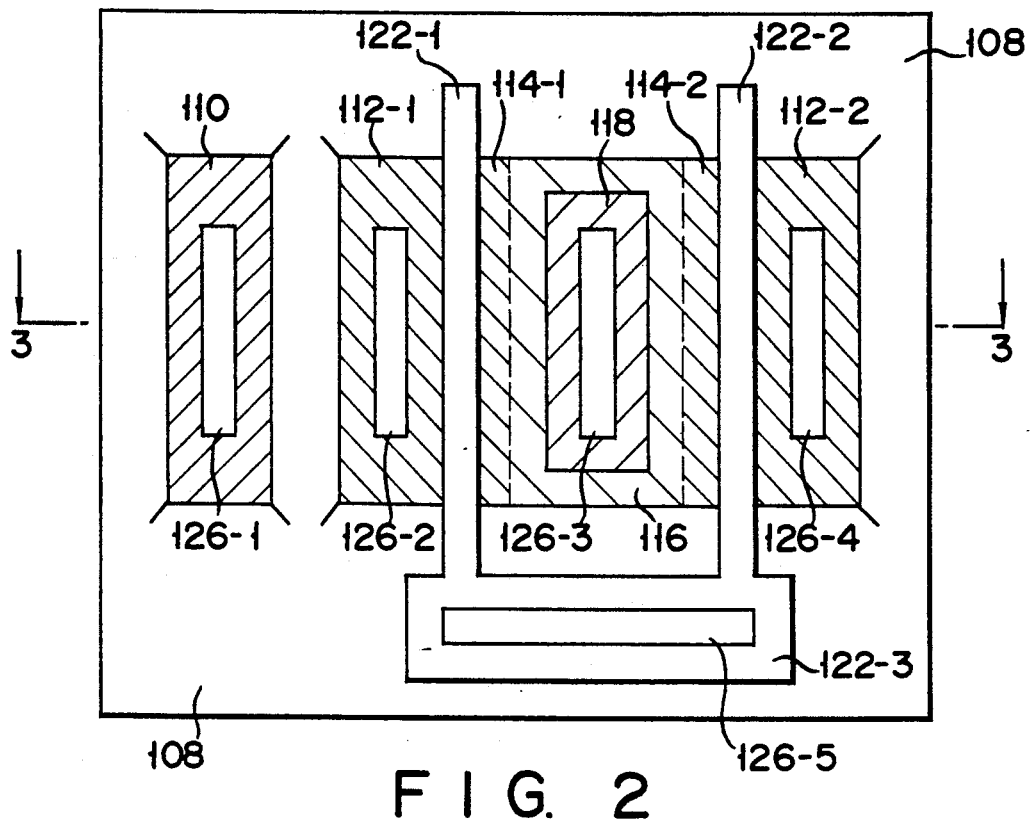
FIG. 2 is a plan view showing an arrangement of a MOSFET input type BiMOS integrated circuit device according to a first embodiment of the present invention.
Figure 3:
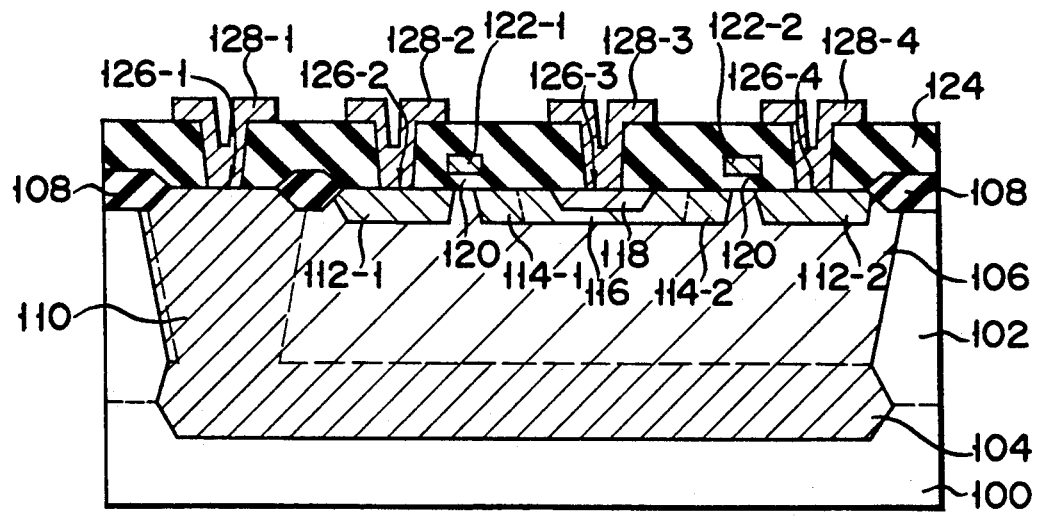
FIG. 3 is a cross-sectional view as taken along line 3—3 in FIG. 2.
Figure 4:
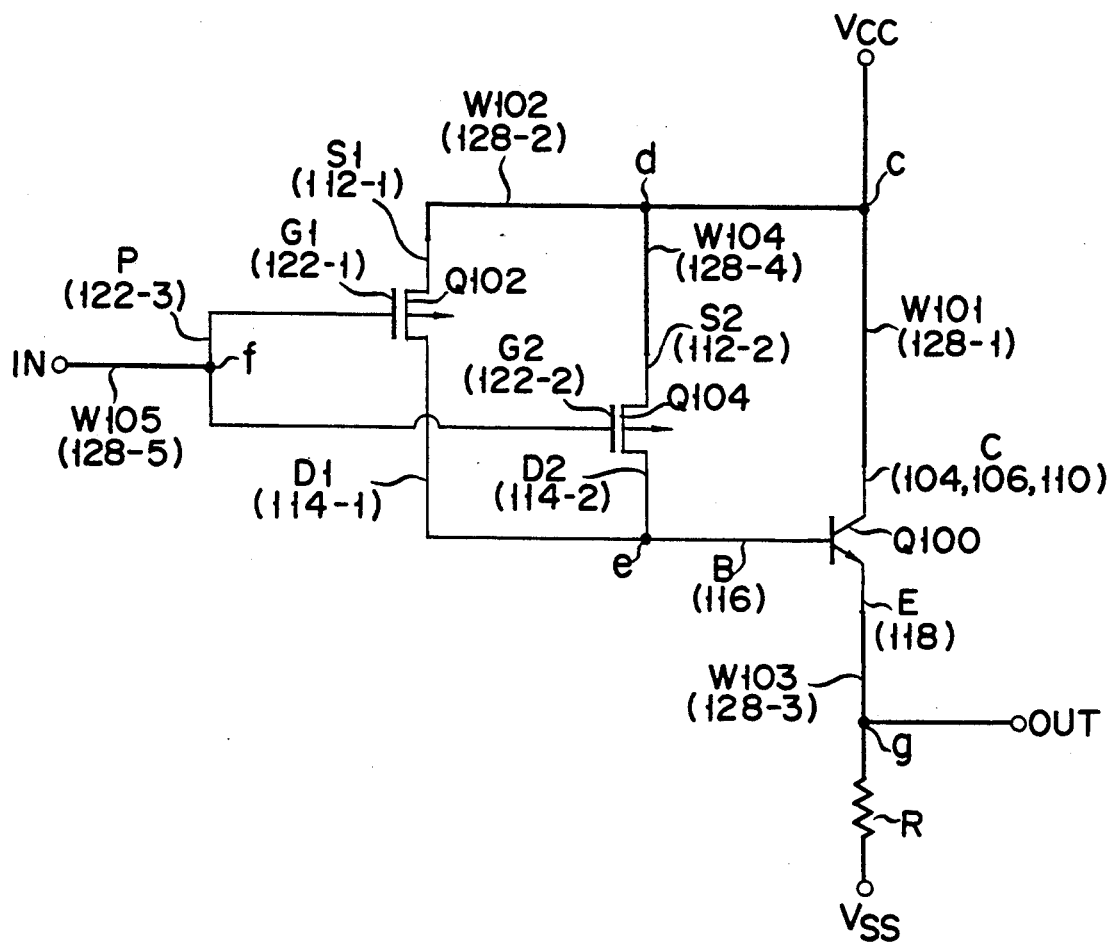
FIG. 4 is an equivalent circuit of an a MOSFET input type BiMOS integrated circuit device having a structure of the first embodiment.

FIG. 2 is a plan view showing a MOSFET input type BiMOS integrated circuit according to a first embodiment of the present invention. FIG. 3 is a cross-sectional view as taken along line 3—3 in FIG. 2. FIG. 4 shows an equivalent circuit of a MOSFET input type BiMOS IC device as shown in FIGS. 2 and 3.

As shown in FIGS. 2 and 3, a p type epitaxial layer 102 is formed on one surface of a p type semiconductor substrate 100. An n type buried layer 104 of high impurity concentration is formed at a boundary between the substrate 100 and the epitaxial layer 102. An n-type well area 106 is formed in the epitaxial layer 102 such that it is located adjacent the buried layer 104 and exposed on the surface of the epitaxial layer 102. The buried layer 104 and well area 106 serve as the collector of a bipolar transistor in the present embodiment. A field insulating film 108 is formed on the surface area of the epitaxial layer 102. An n type collector connection area 110 of high impurity concentration is formed in the n type well area 106 such that it is situated adjacent the buried layer 104 and exposed on the surface of the well area 106. The collector connection area 110 has its surface area boundary surrounded with a field insulating film 108. Two regions, that is, p type source regions 112-1 and 112-2 are formed in the well area 106 in a manner exposed on the surface of the well area 106. Two regions, that is, p type drain regions 114-1 and 114-2 are formed in the well region 106 in a manner exposed on the surface of the well area 106. p Type base region 116 is formed in the surface area of the well area 106 at a location between the drain regions such that it is integral with the drain regions 114-1 and 114-2. n Type emitter region 118 is formed in the base region 116 such that it is exposed on the surface of the base region 116. First and second gate electrodes 122-1 and 122-2 are formed over the surface of the base region 106 at a location between the source regions 112-1, 112-2 and the drain regions 114-1, 114-2 such that they are situated on a gate insulating film 120. One end of each of the first and second gate electrodes 122-1 and 122-2 extends as a free end. The other end of each of the first and second gate electrodes 122-1 and 122-2 is connected to a gate contact area 122-3. The first and second gate electrodes 122-1 and 122-2 are placed at the same potential level. An insulating interlayer 124 is covered on the whole surface of the resultant structure. Contact holes are opened in the insulating interlayer 124 to lead to their respective position. The contact hole 126-1 reaches the collector connection area 110, the contact hole 126-2 the source region 112-1, the contact 126-3 the emitter region 118, and the contact hole 126-4 the source region 112-2. A contact hole 126-5 reaches a gate contact area 122-3. A predetermined metal wire is formed in a corresponding one of these contact holes 126-1 to 126-5. As evident from FIG. 3, the first metal wire 128-1 is formed in the contact hole 126-1, the second metal wire 128-2 in the contact hole 126-2, the third metal wire 128-3 in the contact hole 126-3, and the fourth metal wire 128-4 in the contact hole 126-4. A fifth metal wire 128-5 is formed in the contact hole 126-5, though being not shown in FIGS. 2 and 3. The second metal wire 128-2 is connected to the fourth metal wire 128-4 at a location, not shown.

The equivalent circuit of the MOSFET input type BiMOS IC device a shown in FIGS. 2 and 3 will be explained below with reference to FIG. 4. In the equivalent circuit shown in FIG. 4, a portion or an element corresponding to that shown in FIGS. 2 and 3 is indicated with reference numeral enclosed in parentheses.

As shown in FIG. 4, the equivalent circuit of the present a MOSFET input type BiMOS IC device is composed of one npn type bipolar transistor Q100 and first and second p channel type FET Q102 and Q104, the interconnection of which is as follows:

The collector C (104, 106, 110) of a bipolar transistor Q100 is connected to a high potential source Vcc via a metal wire W101 (128-1). The emitter E (118) of the bipolar transistor Q100 is connected to a load R via a metal wire 103(128-3). The load R is connected to a low potential source Vss. The source S1 (112-1) of a first MOSFET Q102 is connected via a metal wire W102 (128-2) to a node c present between the high potential source Vcc and the collector C of the transistor Q100. The source S2 (112-2) of a second MOSFET Q104 is connected via a metal wire W104 (128-4) to a node d which is situated between the source S1 of the transistor Q102 and the node c. The drain D1 (114-1) of the first MOSFET Q102 is connected to the base B (116) of the bipolar transistor Q100. The drain D1, that is, the drain region 114-1 of the first MOSFET Q102 is formed integral with the base B, that is, the base region 116 of the bipolar transistor Q100 as has already been set forth above in connection with FIGS. 2 and 3. This is the reason why the drain D1 of the first MOSFET Q102 is not connected to the base B of the bipolar transistor Q100 via a metal wire. For convenience in illustration, a location between the drain D1 of the first MOSFET Q102 and the base B of the bipolar transistor Q100 is indicated as a node e. The drain D2 (114-2) of the second MOSFET Q104 is connected to the node e. The drain D2, that is, the drain region 114-2 of the second MOSFET Q104 is formed integral with the base B, that is, the base region 116 of the bipolar transistor Q100 as has already set forth above in connection with FIGS. 2 and 3. This is the reason why the drain D2 of the second MOSFET Q104 is not connected to the base B of the bipolar transistor Q100 via a metal wire. An input signal IN to the integrated circuit is coupled via a metal wire W105 (128-5) to a node f present at the gate contact area P (122-3). The input signal IN propagates past the gate contact area P into the gate G1 (122-1) of the first MOSFET Q102 and into the gate G2 (122-2) of the second MOSFET Q104. An output signal OUT of the integrated circuit is delivered from a node g present between the emitter E of the transistor Q100 and the bipolar load R The load R is connected a low potential second.

In the MOSFET input type BiMOS IC device according to the present embodiment, two gate electrodes 122-1 and 122-2 are formed over an element area defined by the field insulating film 108 as shown in FIGS. 2 and 3. In order to conduct a current across the source region 112-1 and the drain region 114-1 in accordance with a signal input to the gate electrode 122-1, a first channel is formed in the well region 106 under the gate insulating film 120. The same thing can be said about the gate electrode 122-2. In order to conduct a current across the source region 112-2 and drain region 114-2 in accordance with a signal input to the gate electrode 122-2, a second channel is formed in the well area 106 under the gate insulating film 120.

As will be seen from FIGS. 2 to 4, a signal IN which is input to the IC device of the present embodiment is supplied via the metal wire 128-5 to the gate contact area 122-3. Then the input signal IN is input simultaneously to the gate electrodes 122-1 and 122-2 of the transistors Q102 and Q104. When this is done, the aforementioned first and second channels are created, causing MOSFET's Q102 and Q104 to be turned ON simultaneously. With the MOSFET's Q102 and Q104 ON, a current flows from the high potential source Vcc respectively over the metal wires 128-2 and 128-4 to the source regions 112-1 and 112-2 of the MOSFET's Q102 and Q104. The current flows from the source regions 112-1 and 112-2 to the drain regions 114-1 and 114-2 of the MOSFET's Q102 and Q104 respectively across the aforementioned first and second channels simultaneously and is supplied to that base region 116 of the bipolar transistor Q100 which is formed integral with the drain regions 114-1 and 114-2 of the MOSFET's Q102 and Q104. This current is called a base current.

The base current turns the bipolar transistor Q100 ON. With the bipolar transistor Q100 ON, a current (collector current) flows from the high potential source Vcc into the collector region (104, 106 and 110) over the metal wire 128-1. The emitter current in the bipolar transistor Q100 flows from that emitter region 118 over the metal wire 128-3 into a low potential source Vss through a load R. An output signal is delivered from node g between an emitter region 118 and a load R.

Figure 1:
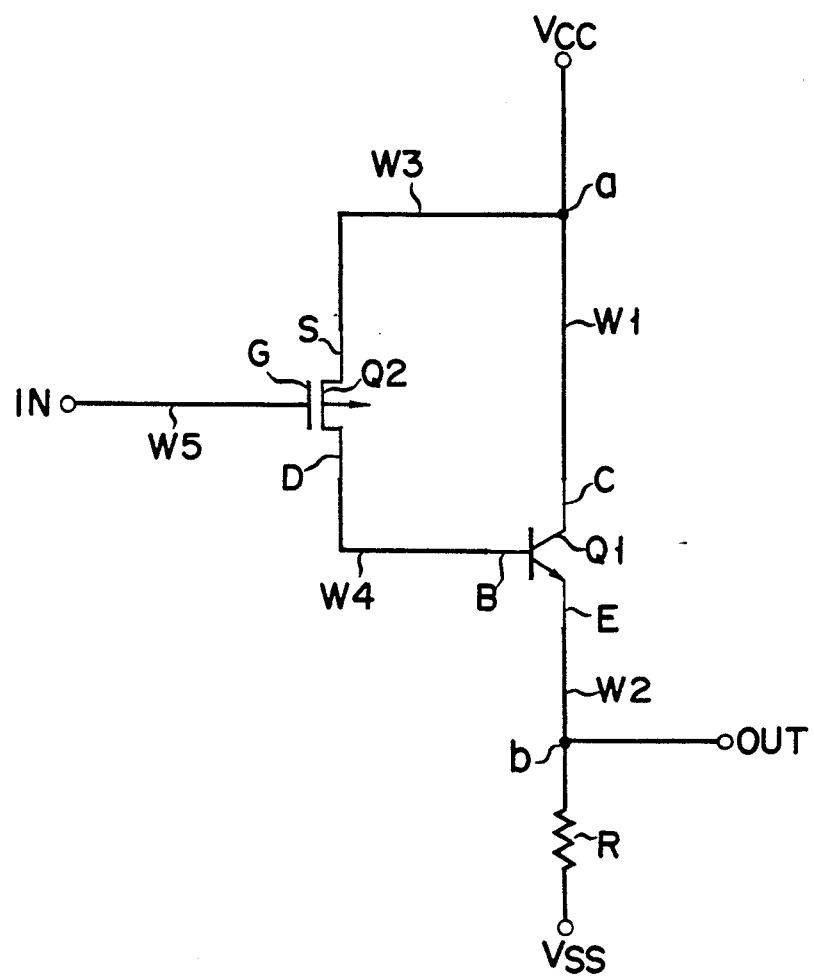
FIG. 1 is a conventional circuit showing a MOSFET input type BiMOS integrated circuit device.

In the conventional MOSFET input type BiMOS integrated circuit, the base current is supplied to the bipolar transistor Q1 by the single MOSFET Q2 as shown in FIG. 1. For this reason, the base current is determined by the current capacity of the single MOSFET and reveals no adequate drive capability against a subsequent stage of an element.

In the MOSFET input type BiMOS IC device according to the present invention, however, the base current is supplied to the bipolar transistor Q100 by two MOSFET's Q102 and Q104 as seen from the equivalent circuit shown in FIG. 4. Given that, in the present embodiment, the current capacity of one MOSFET is equal to that of the counterpart of the conventional MOSFET input type BiMOS integrated circuit, the present embodiment can provide nearly double the base current supply capability and hence an enhanced drive capability against a subsequent stage element.

It is, therefore, possible to obtain a vertical type bipolar transistor (corresponding to the transistor Q100 in FIG. 4) of an adequate capability as a unit of high amplification factor and hence to obtain an adequately amplified output signal OUT.

It is also possible to achieve a practical high-speed operation unit upon comparison with that of the conventional integrated circuit because an adequately great base current can be supplied to, and drawn from, the base of the bipolar transistor. This high-speed operation feature is prominently obtained because, as shown in FIGS. 2 and 3, the drain regions 114-1 and 114-2 are formed integral with the base region 116.

In the first embodiment, a practical high integration density unit is achieved because of the integral structure of the drain regions 114-1 and 114-2 and base region 116.

Further, an integral area of the drain regions 114-1, 114-2 and base region 118 is provided between the first and second gate electrodes 122-1 and 122-2. That is, the MOSFET's in the first embodiment do not take up any larger area and can assure double the channel width.

A current flows into the base region 118 via the two opposite drain regions of the integral area, as a result the IC device of the first embodiment can obtain a base current equal in extent to that obtained by an IC device using a bipolar transistor of a double base type.

One form of an integrated circuit using the IC device of the first embodiment will be explained below with reference to FIG. 5. In FIG. 5, the same reference numerals are employed to designate a portion or an element corresponding to that shown in FIG. 4.

The IC logic circuit of FIG. 5 is composed of a BiCMOS type inverter circuit. A dash-line box 300 in FIG. 5 shows a portion of an IC device of the first embodiment, and a dash-line box 302 in FIG. 5 shows a portion of an IC device complementary to the IC device of the first embodiment.

The operation of the IC logic circuit shown in FIG. 5 will be explained below. It is to be noted that a high and a low level signal are referred to as "1" and "0", respectively.

First, an explanation will be given below about the case where an input signal IN is at a "0" level.

A "0" level input signal IN is supplied over a metal wire W105 to a node f and hence to a gate contact area P. The input signal IN is fed from the node f to a node f' in the gate contact area P. In this way, the input signal IN is input to a p channel type MOSFET Q102 and p channel type MOSFET Q104, causing these MOSFET's to be turned ON. With MOSFET's Q102 and Q104 ON, an npn type bipolar transistor Q100 is turned ON, placing a node g at a high potential level.

On the other hand, the "0" level input signal IN is also supplied from the node f to a node f'' present in the gate contact area P. In this way, the input signal IN is fed to n channel type MOSFET's Q108 and Q110, causing these MOSFET's to be turned OFF. At this time, a pnp type bipolar transistor Q106 is turned OFF.

As a result, a "1" level output signal OUT emerges from the node g.

Now let it be assumed that the input signal IN is at the "1" level.

With the input signal IN at the "1" level, MOSFET's Q102 and Q104 are turned OFF, causing the bipolar transistor Q100 to be turned OFF.

On the other hand, MOSFET' Q108 and Q110 are turned ON, causing the pnp type bipolar transistor Q106 is turned ON. As a result, a "0" level output signal OUT emerges from the node g.

In this way, the IC logic circuit shown in FIG. 5 delivers a "1" level output signal OUT when the input signal IN is at the "0" level and a "0" level output signal OUT when the input signal IN is at the "1" level, that is, it serves as an inverter circuit.

As seen from the above, the integrated circuit of the first embodiment can be applied to a portion of, for example, the inverter circuit.

The circuit portion as indicated by the dash-line box 302 in the circuit arrangement shown in FIG. 5 constitutes the IC device complementary to that of the first embodiment, that is, an MOSFET input type inverted BiMOS IC device. The IC device as defined by the dash line box 302 may be of such a type that the conductivity type of the transistors in the integrated circuit shown, for example, in FIGS. 2 and 3 is reversed to the opposite type.

EMBODIMENT 2

Figure 6:
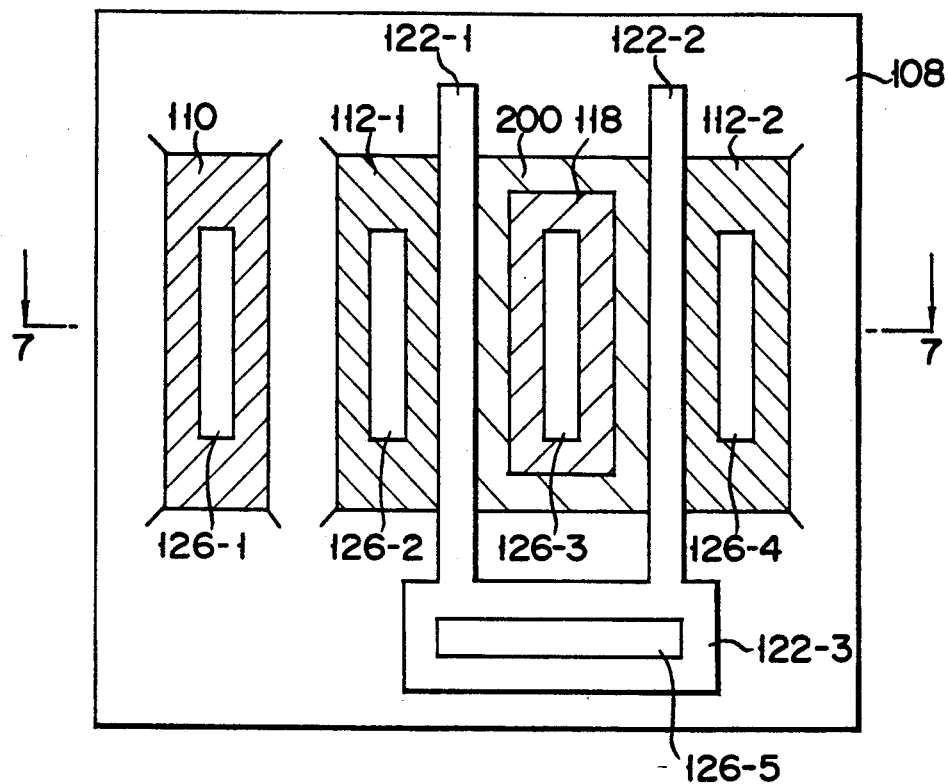
FIG. 6 is a plan view showing a MOSFET input type BiMOS integrated circuit device according to a second embodiment of the present invention.
Figure 7:
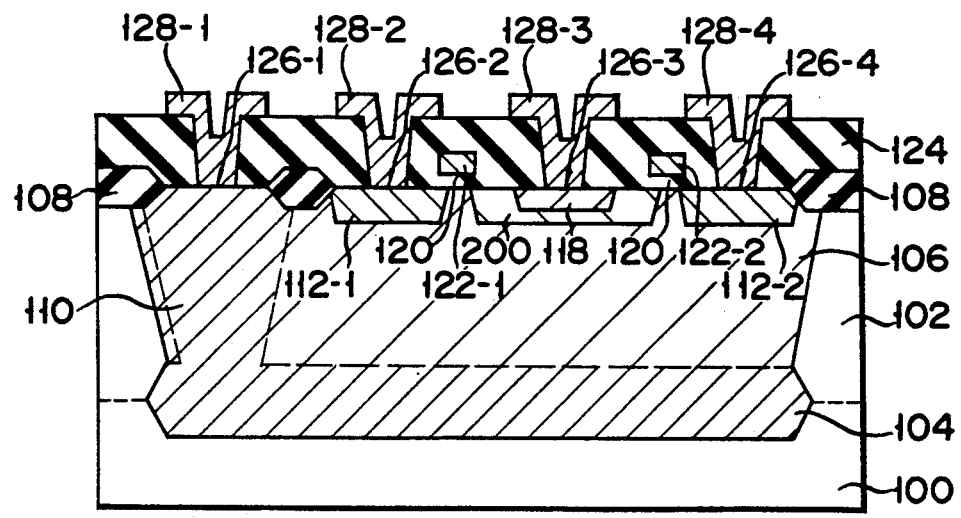
FIG. 7 is a cross-sectional view as taken along line 7—7 in FIG. 6.

An MOSFET input type BiMOS IC device according to a second embodiment of the present invention will be explained below with reference to FIGS. 6 and 7. In FIGS. 6 and 7, the same reference numerals are employed to designate a portion or an element corresponding to that shown in FIGS. 2 and 3. A detailed explanation is, therefore, omitted for brevity's sake.

FIG. 6 is a plan view showing an IC device according to a second embodiment of the present invention and FIG. 7 is a cross-sectional view, as taken along line 7—7 in FIG. 6.

In the IC device of the second embodiment as shown in FIGS. 6 and 7, drain and base regions are set at the same impurity concentration level, the area having the same impurity concentration level being shown as a p type semiconductor area 200.

The drain region usually contains an impurity of high concentration level from the standpoint of its ohmic contact with a connection metal.

According to the present invention, however, it is not necessarily required that the metal wire contact with the drain region and that the drain region be set to an impurity concentration level high enough to be held in ohmic contact relation.

From this viewpoint, the IC device of the second embodiment is so formed that the drain region and the base region integral with the drain region are formed as the p type semiconductor region 200 of the same impurity concentration level.

The lower the impurity concentration level of the base region of the bipolar transistor, the closer to "1" the grounded-base DC amplification factor $\alpha$ can be brought. If the grounded-base DC amplification factor $\alpha$ is closer to "1", the grounded-emitter DC amplification becomes greater. For example, the Darlington circuit is a typical, grounded-emitter circuit. The IC device of the present invention ensures a high amplification factor if the base region is set to a low impurity concentration level.

The impurity concentration of the drain region of the MOSFET, if being more lowered, can alleviate an electric field in the neighborhood of the drain region. If the electric field in the neighborhood of the drain region is alleviated, the generation of hot carriers is suppressed, thus preventing the degradation of the characteristic of the IC device. This has already been proved particularly on an LDD (lightly doped drain) type MOSFET.

In the IC device of the second embodiment, the impurity concentration of the base and drain regions, that is, the p type semiconductor area 200, is set to, for example, $1 \times 10^{18}$ cm$^{-3}$.

Thus both the base and drain regions are made at a low impurity concentration level.

The IC device of the second embodiment can obtain not only the advantage of the integrated circuit of the first embodiment but also a bipolar transistor of high amplification factor and MOSFET of high reliability.

Manufacturing Method 1

A first method for manufacturing a MOSFET input type BiMOS integrated circuit according to the present invention will be explained below with reference to FIGS. 8A to 8J. In FIGS. 8A to 8J, the same reference numerals are employed to designate a portion or an element corresponding to that shown in FIGS. 6 and 7.

First a buried layer pattern is formed by a photoetching method in one surface of, for example, a p type silicon substrate 100 with the use of a photoresist, not shown. Then an n type impurity, such as phosphorus (p) and antimony (Sb), is ion implanted into the p type silicon substrate 100 with a photoresist pattern, not shown, as a mask. The n type impurity is diffused, by heat treatment, into the p type silicon substrate 100 to form an n type buried layer 104. Alternatively, the surface of the p type silicon substrate 100 is subjected to thermal oxidation to form a thermal oxidation film, not shown. Then an opening for a buried layer pattern is formed, by the photoetching method, in the thermal oxidation film, not shown. A CVD-silicon oxide film, not shown, containing an n type impurity such as phosphorus (p) and antimony (Sb) is formed by a CVD method on the whole surface of the resultant structure.

An annealing step may be employed to allow an n type impurity to be diffused from the CVD-silicon oxide film, not shown, into the p type silicon substrate to form an n type buried layer 104. Then a p type epitaxial layer 102 of, for example, about 1 to 5 μm is grown by the CVD method on the whole surface of the resultant structure.

As shown in FIG. 8B, a photoresist, not shown, is coated on the whole surface of the resultant structure and, using the photoresist, a well area pattern is formed by the photoetching method in the semiconductor structure. With the photoresist pattern, not shown, as a mask, an n type impurity ion, such as phosphorus (p), is implanted into the p type epitaxial layer 102. Then phosphorus (p) is diffused into the p-type epitaxial layer 102 by heat treatment to form an n type well area 106. A field insulating film 108 is selectively formed, by an LOCOS method for example, on the surface of the p type epitaxial layer 102. A photoresist, not shown, is coated on the whole surface of the resultant structure and a collector connection area pattern is formed by the photoetching method on the structure with the use of a photoresist, not shown. With the photoresist pattern, not shown, as a mask, an n type impurity such as phosphorus (p) is ion implanted in the n type well area 106. The phosphorus (p) is diffused, by heat treatment, into the n type well area 106 to form an n type collector connection area 110.

Figure 8C:
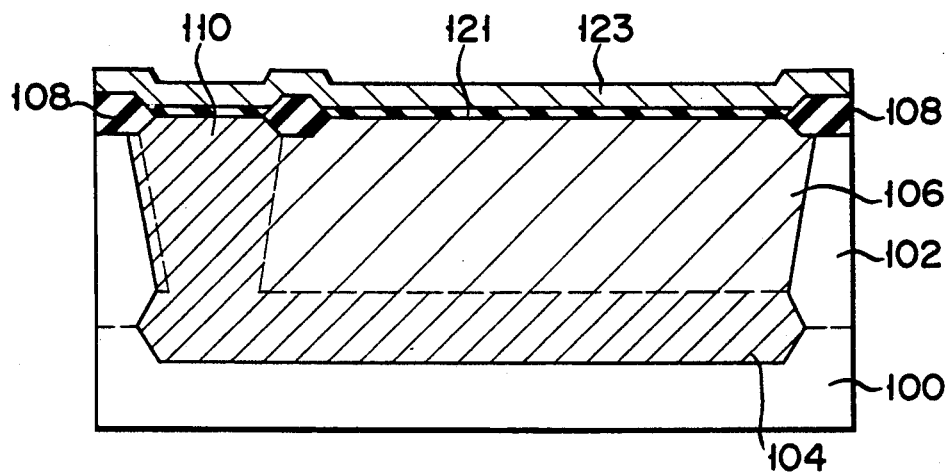

As shown in FIG. 8C, a thermal oxide film 120 which serves as a gate oxide film is formed on the whole surface of the resultant structure by, for example, thermal oxidation. Then a polysilicon layer 123 serving as a gate electrode is formed by, for example, a CVD method on the whole surface of the resultant structure.

Figure 8D:
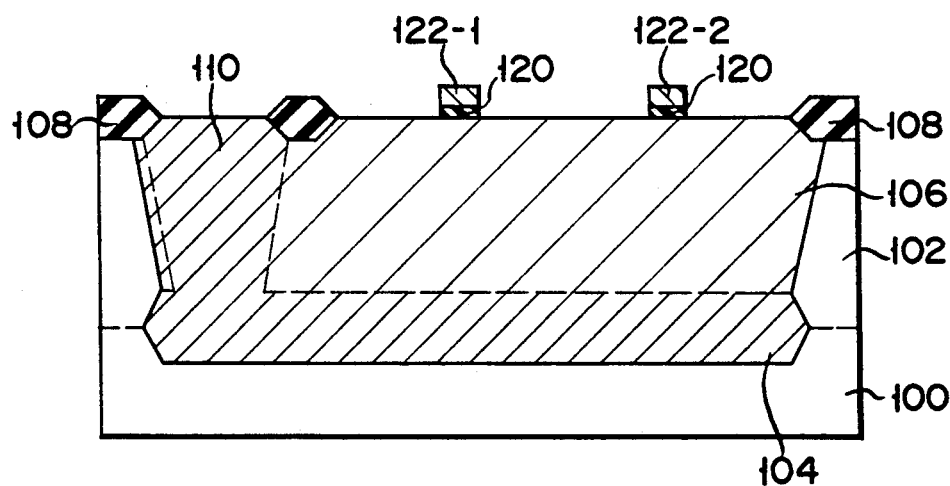

As shown in FIG. 8D, a photoresist, not shown, is coated on the whole surface of the resultant surface and, using the photoresist not shown, a gate electrode pattern is formed on the structure by the photoetching method. With the photoresist pattern as a mask, not shown, the polysilicon layer 123 is etched to form gate electrodes 122-1 and 122-2.

In the formation of the integrated circuit as shown in the first and second embodiments, the aforementioned photoresist pattern is formed in a manner to include a pattern of the gate contact area 122-3 as shown in FIGS. 2 and 6.

Then the aforementioned etching is continued with another etchant in which case the thermal oxidation film 121 is etched. At this time, those portions of the thermal oxidation film 121 situated under the gate electrodes 122-1 and 122-2 are left to provide gate oxide films 120.

Thereafter, the photoresist, not shown, is removed.

Figure 8E:
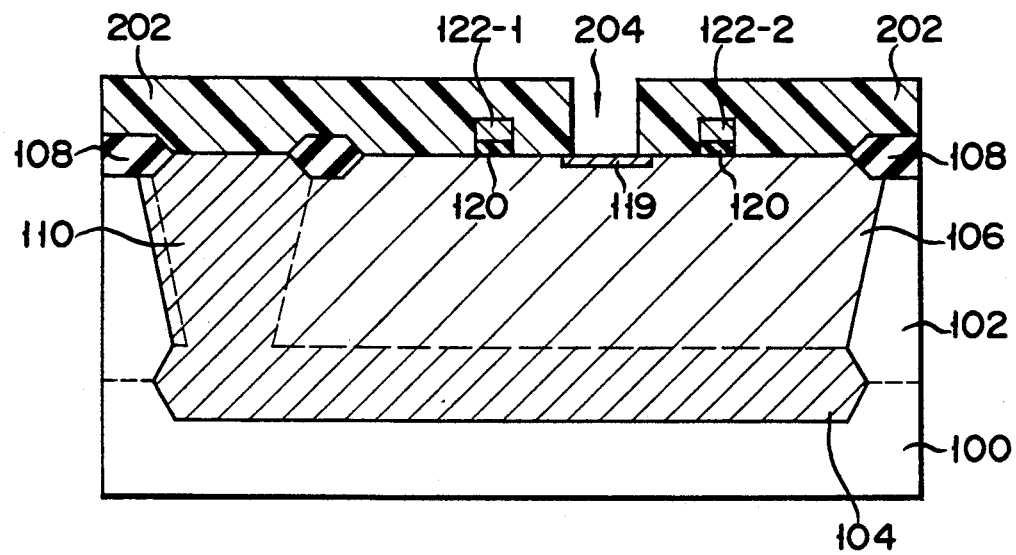

As shown in FIG. 8E, a photoresist 202 is coated on the whole surface of the resultant structure and, using the photoetching method, an emitter region pattern is formed at the photoresist 202. That pattern is indicated as an opening 204. Then with the photoresist pattern as a mask an n type impurity such as arsenic (As) is ion implanted into the n type well area 106. The ion implantation step is performed, for example, in a does of 533 $10^{15}$ cm$^{-2}$ at an acceleration voltage of 40 KeV. A region obtained by the ion implantation step is indicated as an n type impurity ion implanted region 119.

The the photoresist 202 is removed from the rest of the structure.

Figure 8F:
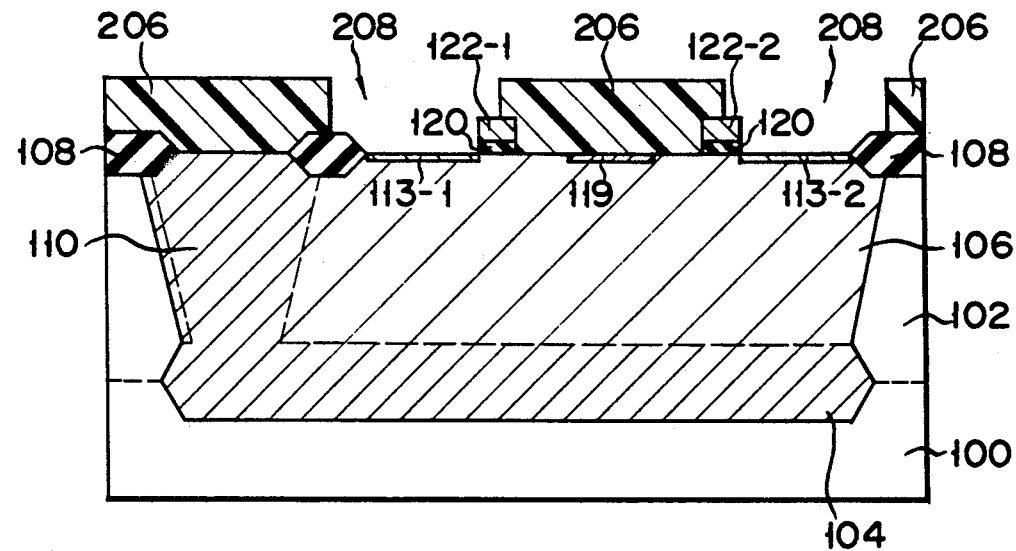

Then as shown in FIG. 8F a photoresist 206 is coated on the whole surface of the resultant structure and a source region pattern is formed at the photoresist 206, using a photoetching method The pattern is shown as an opening 208 in FIG. 8F.

In the manufacture of the integrated circuit of the second embodiment, the pattern for the photoresist 206 is covered with the photoresist 206 at a location between the gate electrodes 122-1 and 122-2. This is done to prevent an impurity for the formation of a source region from being implanted into a drain region.

In the manufacture of the integrated circuit according to the first embodiment of the present invention, the pattern of the aforementioned photoresist 206 may not cover a location between the gate electrodes 122-1 and 122-2.

Then with the photoresist pattern as a mask a p type impurity such as boron (B) is ion implanted into the n type well region 106 The ion implantation step is performed, for example, in a dose of $5 \times 10^{15}$ cm$^{-2}$ an acceleration voltage of 20 KeV. Those regions obtained by the ion implantation step are indicated as p type impurity ion implanted regions 113-1 and 113-2.

Then the photoresist 206 is removed from the rest of the resultant structure.

As shown in FIG. 8G, a photoresist 210 is coated by a photoetching method on the whole surface of the semiconductor structure and a base/drain region pattern is formed at the photoresist 210. The pattern is indicated as an opening 212. Then with the photoresist pattern as a mask a p type impurity such as boron is ion implanted into the n type well area. The ion implantation step is performed, for example, in a dose of $3 \times 10^{13}$ cm$^{-2}$ at an acceleration voltage of 25 KeV. An area obtained by the ion implantation step is indicated as a p type ion implanted area 201.

Then the photoresist 210 is removed from the rest of the resultant structure.

As shown in FIG. 8H, a CVD silicon oxide film 124 is formed, by a CVD method for example, on the surface of the resultant structure. The CVD silicon oxide film 124 provides an insulating interlayer. A predetermined annealing step is carried out to allow the impurity of the n type ion implanted region 119 and that of the p type ion implanted regions 113-1, 113-2 and 201 to be simultaneously diffused into the n type well area 106. This results in the formation of p type source regions 112-1 and 112-2, p type semiconductor area 200 (a base region and drain region) and n type emitter region 118. At that time, the emitter region 118 is formed as an island-like region in the p type semiconductor area 200 due to, for example, a difference in a diffusion coefficient between the arsenic and the boron.

Figure 8I:
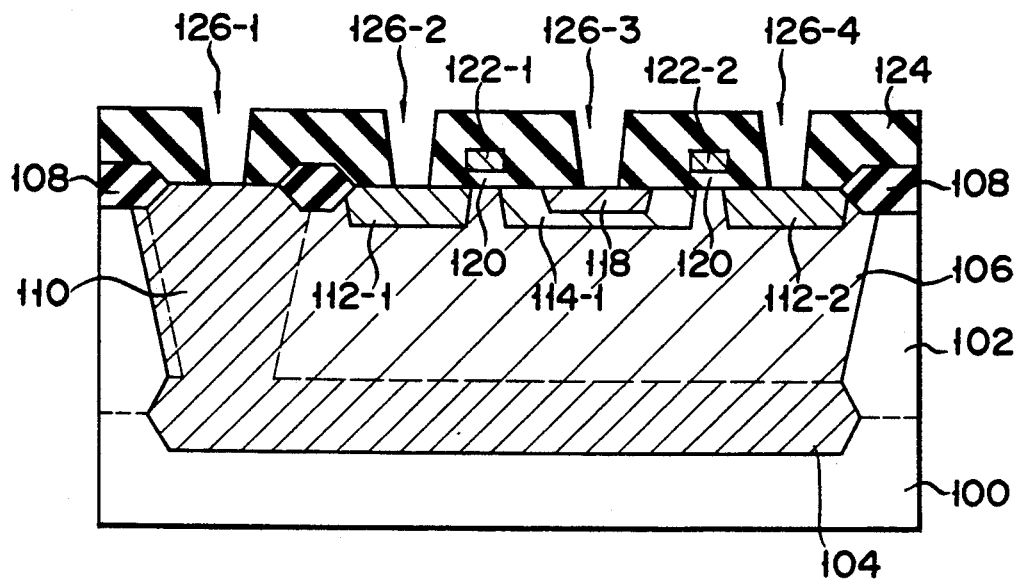

As shown in FIG. 8I, a photoresist, not shown, is coated on the whole surface of the resultant structure and a contact hole-opening pattern is formed by the photoetching method at the photoresist not shown. Then the CVD silicon oxide film 124 is etched with the photoresist pattern, not shown, as a mask. The etching step is performed, for example, firstly by a lightly isotropic etching using a CDE method and then an anisotropic etching using an RIE method to reach a predetermined location.

This step results in opening contact holes 126-1 to 126-4. Though not shown, a contact hole 126-5 is also formed which leads to a gate contact area 122-3.

Figure 8J:
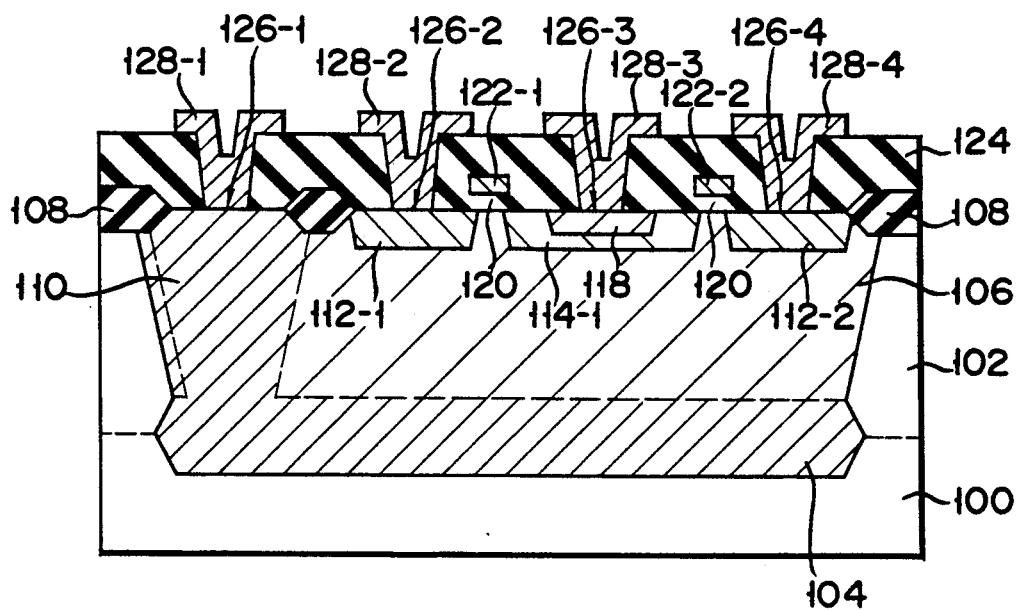

As shown in FIG. 8J, a metal layer such as an aluminum layer is formed, by a sputtering method for example, over the whole surface of the structure and the aluminum layer is patterned, by the photoetching method for example, to provide metal wirings 126-1 to 126-5 in a predetermined pattern.

It is thus possible to manufacture a MOSFET input type Darlington integrated circuit.

According to the first manufacturing method, the source regions 112-1 and 112-2, emitter region 118 and p type semiconductor area 200 can be formed by a single annealing step. It is possible, therefore, to reduce the requisite heating steps.

Manufacturing Method 2

A second method for the manufacture of a MOSFET input type BiMOS integrated circuit according to the present invention will be explained below with reference to FIGS. 9A to 9F in which the same reference numerals are employed to designate a portion or an element corresponding to that shown in FIGS. 8A to 8J.

Those steps up to the step shown in FIG. 9A are the same as those shown in FIGS. 8A to 8D and further explanation is therefore omitted.

Then as shown in FIG. 9B a photoresist 214 is coated on the whole surface of the resultant structure and a pattern for the base and drain regions are formed by the photoetching method at the photoresist 214. This pattern is indicated by an opening 216 in FIG. 9B. Then with the photoresist pattern as a mask a p type impurity such as boron (B) is ion implanted into the n type well area 106. For example, the ion implanting step can be effected in a dose of $1 \times 10^{13}$ cm$^{-2}$ at an acceleration voltage of 20 KeV. An ion implanted location is indicated as a p type ion implanted region 201.

Then the photoresist 214 is removed from the rest of the resultant structure.

As shown in FIG. 9C, a predetermined annealing step is carried out to allow the impurity ion in the p type ion implanted area 201 to be diffused in the n type well area 106. This step results in the formation of a p type semiconductor area (base and drain regions) 200.

As shown in FIG. 9D, a photoresist 218 is coated on the whole surface of the resultant structure and an emitter region pattern is formed by a photoetching method at the photoresist. The pattern is indicated as an opening 220 in FIG. 9D. With the photoresist pattern as a mask, an n type impurity such as arsenic (As) is ion implanted into the p type semiconductor area 200. This ion implantation step is effected, for example, in a dose of $5 \times 10^{15}$ cm$^{-2}$ at an acceleration voltage of 40 KeV. The ion implanted region is indicated by an n type ion implanted region 119 in FIG. 9D.

The photoresist 218 is removed from the rest of the resultant structure.

As shown in FIG. 9E, a photoresist 222 is coated on the whole surface of the structure and a source region pattern is formed by the photoetching method at the photoresist 222. The pattern is indicated as an opening 224 in FIG. 9E. Then with the photoresist pattern as a mask a p type impurity such as boron (B) is ion implanted into the n type well area 106. The ion implanting step is performed, for example, in a dose of $5 \times 10^{15}$ cm$^{-2}$ at an acceleration voltage 20 KeV. Those regions thus ion implanted are indicated as p type ion implanted regions 113-1 and 113-2.

The photoresist 222 is removed from the rest of the structure.

Then as shown in FIG. 9F a CVD-silicon oxide film 124 is deposited, by a CVD method for example, on the resultant structure. The CVD-silicon oxide film 124 serves as an insulating interlayer. A predetermined annealing step is carried out to allow the impurity of the n type ion implanted region 119 and that of the p type ion implanted regions 113-1 and 113-2 to be simultaneously diffused into the n type well area 106. This annealing step results in the formation of p type source regions 112-1 and 112-2 and n type emitter region 118.

The subsequent steps are the same as those shown in FIGS. 8I to 8J and no further explanation is therefore omitted.

By doing so it is possible to manufacture a MOSFET input type BiMOS integrated circuit device.

According to the second method of the present invention, the diffusion of the p type semiconductor area 200 is followed by the diffusion of p type source regions 112-1 and 112-2 as well as n type emitter region 118. That is, the diffusion step is effected by two annealing steps.

The merit of the present manufacturing method lies in that it is possible to combine it with the manufacture of other bipolar transistors and MOSFET's.

Stated in more detail, firstly a common ion-implantation step can be used for the formation of the p type semiconductor area 200 and that of other bipolar transistors.

Secondly, the diffusion of the p type semiconductor area 200 and that of other bipolar transistors can be effected in the same step.

Thirdly a common ion-implantation step can be used for the n type emitter region 118 and the source and drain regions of other n channel MOSFET's.

Fourthly, a common ion-implantation step can be used for the p type source regions 112-1 and 112-2 and other p channel source and drain regions.

In the second manufacturing method, the MOSFET input type BiMOS integrated circuit can be formed without interfering with the formation of other bipolar transistors and MOSFET's and without the need to increase the manufacturing steps.

Thus the second manufacturing method proves effective to the incorporation of the present MOSFET input BiMOS integrated circuit device into a Bi-CMOS semiconductor device.

By the second manufacturing method, the integrated circuit device of the first embodiment can be manufactured, for example, with the change of mask patterns.

EMBODIMENT 3

An MOSFET input type BiMOS integrated circuit device according to a third embodiment of the present invention will be explained below with reference to FIGS. 10 and 11. In FIGS. 10 and 11, the same reference numerals are employed to designate a portion or an element corresponding to that shown in FIGS. 2 and 3 and further explanation will be omitted for brevity's sake.

FIG. 10 is a plan view showing an integrated circuit according to the third embodiment of the present invention and FIG. 11 is a cross-sectional view taken along line 11—11 in FIG. 10.

As shown in FIGS. 10 and 11, the integrated circuit device of the third embodiment is of such a type that a third gate electrode 122-4 connects a first gate electrode 122-1 to a second gate electrode 122-2. In the arrangement shown in FIGS. 10 and 11, a source region 112-3 is formed along the first, second and third gate electrodes 122-1, 122-2 and 122-4. A drain region 114-3 is formed along the first, second and third electrodes 122-1, 122-2 and 122-4.

In the integrated circuit device of the third embodiment, a greater channel width is obtained for a MOSFET.

Stated in more detail, channel widths are obtained one for the first gate electrode, one for the second gate electrode and one for the third gate electrode 122-4.

Therefore, the integrated circuit device of the third embodiment includes MOSFET's having a higher device drive capability.

The device of the third embodiment can be manufactured by the first and second manufacturing methods in which case it is only necessary to employ a corresponding mask pattern.

Although tin the third embodiment the drain region contacts with the three sides of the gate electrode area, that is, the first, second and third gate electrodes 122-1, 122-2 and 122-4, it may contact with the three or more sides of the gate electrode area to achieve an increase in the number of channels.

In the first to the third embodiments, a single collector connection area 110 is provided, but two or more areas may be provided as such. For example, at least two collector connection areas may be provided in a symmetrical relation to the emitter region 118. This achieves a decreased contact resistance at the location of the collector region.

Although in the first and second embodiments the gate electrode is straight in configuration, it may be curved as, for example, an el shape " ". In the third embodiment, the pattern of the gate electrode may be circular or semicircular in configuration in which case the number of channels are increased.

In the first to the third embodiments and their manufacturing methods, the p type epitaxial layer 102 is employed. However, an n type epitaxial layer may be formed instead of the p type one. In this case, in order to make associated areas other than the n type collector formation area a p type, the p type impurity is ion implanted and diffused for pn isolation.

EMBODIMENT 4

A MOSFET input type BiMOS integrated circuit device according to a fourth embodiment of the present invention will be explained below with reference to FIGS. 12 and 13. The same reference numerals are employed to designate a portion or an element corresponding to that shown in FIGS. 6 and 7 and further explanation is omitted for brevity's sake.

FIG. 12 is a plan view showing an integrated circuit device according to the fourth embodiment of the present invention and FIG. 13 is a cross-sectional view as taken along line 13—13 in FIG. 12.

As shown in FIGS. 12 and 13, the integrated circuit device of the fourth embodiment is manufactured by applying the aforementioned base/drain structure of the same impurity concentration to the third embodiment of the present invention. The structure of the same impurity concentration is indicated by the p type semiconductor area 200 in FIGS. 12 and 13.

The integrated circuit device of the fourth embodiment includes MOSFET a higher device drive capability and can achieve a bipolar transistor of a high amplification factor and MOSFET of high reliability.

EMBODIMENT 5

A MOSFET input type BiMOS integrated circuit of a fifth embodiment will be explained below with reference to FIGS. 14 to 16. In FIGS. 14 to 16, the same reference numerals are employed to designate a portion or an element corresponding to that shown in FIGS. 2 to 4 and further explanation is, therefore, omitted for brevity's sake.

FIG. 14 is a plan view showing an integrated circuit device according to the fifth embodiment of the present invention, FIG. 15 is a cross-sectional view as taken along line 15—15 in FIG. 14, and FIG. 16 is an equivalent circuit showing the integrated circuit device of the fifth embodiment.

As shown in FIGS. 14 and 15, the integrated circuit device of the fifth embodiment is of such a type that first and second gate electrodes 122-1 and 122-2 are separated from each other. One end of each of the first and second gate electrodes 122-1 and 122-2 extends as a free end as in the first and second embodiments. The end of each of the first and second gate electrodes provides a free end in the fifth embodiment of the present invention. First and second gate contact areas 122-5 and 122-6 are formed at the corresponding other ends of the first and second gate electrodes. An insulating interlayer 124 is covered over the whole surface of the semiconductor structure. Contact holes 126-7 and 126-8 leading to the first and second gate contact areas 122-5 and 122-6, respectively are formed at the insulating interlayer 124. A metal wire 128-7, not shown, is formed in the contact hole 126-7 and a metal wire 128-8, not shown, is formed in the contact holes 126-8.

As will be seen from the above, the first and second gate electrodes 122-1 and 122-2 are not connected by, for example, a gate contact area.

In the integrated circuit device of the fifth embodiment, the first and second gate electrodes 122-1 and 122-2 serve as gate electrodes, respectively, for one MOSFET.

An equivalent circuit for the MOSFET input type Darlington IC device as shown in FIGS. 14 and 15 will be explained below with reference to FIG. 16. In the equivalent circuit shown in FIG. 16, the same reference numerals are employed to designate a part or an element corresponding to that shown in FIGS. 14 and 15 with parentheses added to reference numerals.

In the equivalent circuit shown in FIG. 16, duplications are eliminated from the countpart of FIG. 4 so as to indicate only different portions or elements.

As shown in FIG. 16, a first input signal IN1 is supplied through a metal wire 107 (128-7) and gate contact area 122-5, not shown, to a first gate electrode G1 (122-1). A second input signal IN2 is supplied through a metal wire W108 (128-8) and gate contact area 122-6, not shown, to a second gate electrode G2 (122-2).

In the IC device of the fifth embodiment, the first MOSFET Q102 is turned ON upon receipt of a first input signal IN1 and the second MOSFET Q104 is turned ON upon receipt of a second input signal IN2. Thus the IC device of the fifth embodiment serves as a MOSFET two-input type BiMOS IC device.

In the IC device of the fifth embodiment, it is possible to decrease an area occupied by the MOSFET two-input/one-output type BiMOS IC device, because the drain region is formed integral with the base region.

Thus the fifth embodiment of the present invention provides a MOSFET two-input/one-output type BiMOS IC device advantageous to high integration density.

A logic integrated circuit using the IC device of the fifth embodiment will be explained below, by way of example, with reference to FIG. 17. The same reference numerals are employed to designate a portion or an element corresponding to that shown in FIG. 16.

A logic integrated circuit shown in FIG. 17 serves as a Bi-CMOS type NAND circuit. In the circuit arrangement shown in FIG. 17, a dash-line box 304 as indicated by the broken lines shows the IC device of the fifth embodiment of the present invention.

The operation of the logic integrated circuit as shown in FIG. 17 will be explained below. In the explanation given below, the high and low level signals are indicated as "1" and "0", respectively.

Let it be first assumed that first and second input signals are "0" and "0", respectively.

The "0" level input signal IN1 is input via a metal wire W107 to a p channel type MOSFET Q102, causing the MOSFET Q102 to be turned ON. Similarly, the "0" level input signal IN2 is input via a metal wire W108 to a p channel type MOSFET Q104, causing the MOSFET Q104 to be turned ON. With the MOSFET Q102 and Q104 ON, an npn type bipolar transistor Q100 are turned ON. As a result, a high potential emerges on a node g.

The "0" level input signal IN1 is branched to a metal wire W109 at a location of a node h on the metal wire 107 and input to an n channel type MOSFET Q114 via the metal wire W109, causing the MOSFET Q114 to be turned OFF. Similarly, the "0" level input signal IN2 is branched to a metal wire 110 at a location of a node i present on the metal wire 108 and input to an n channel type MOSFET 116 via the metal wire W108, causing the MOSFET Q116 to be turned OFF. With the MOSFET's Q114 and Q116 OFF, an pnp type bipolar transistor Q112 is turned OFF.

As a result, a "1" level output signal OUT emerges from a node g.

Let it now be assumed that the first and second input signals IN1 and IN2 are "1" and "0", respectively.

Since, in this case, IN1=1, MOSFET's Q102 and Q114 are turned OFF and ON, respectively. On the other hand, MOSFET's Q104 and Q116 are turned ON and OFF, respectively, so that bipolar transistor Q100 are turned ON and bipolar transistor Q112 is turned OFF.

As a result, a "1" level output signal OUT appears on the node g.

Suppose that the first and second input signals IN1 and IN2 are "0" and "1", respectively. In this case, IN1=0 MOSFET's Q102 and Q114 are turned ON and OFF, respectively and since IN2=1, MOSFET's Q104 and Q116 are turned OFF and ON, respectively. Thus bipolar transistor Q112 is turned OFF and transistor Q100 is turned ON.

As a result, a "1" level output signal OUT emerges from the node g.

Now suppose that the first and second input signals IN1 and IN2 are "1" and "1", respectively.

In this case, since IN1=IN2=1, MOSFET's Q102 and Q104 are turned OFF, causing the bipolar transistor Q100 to be turned OFF.

MOSFET's Q114 and Q116 are turned ON and the bipolar transistor Q112 is turned ON.

A "0" output signal OUT emerges from the node g.

As set forth above, in the logic integrated circuit shown in FIG. 17 a "0" level output signal emerges only when IN1=IN2=1. That is, it serves as a NAND circuit.

As is evident from the above, the IC device of the fifth embodiment can be applied to a portion of a circuit including, for example, a NAND circuit.

EMBODIMENT 6

A MOSFET input type BiMOS IC device according to a sixth embodiment of the present invention will be explained below with reference to FIGS. 18 and 19. In FIGS. 18 and 19, the same reference numeral is employed to designate a portion or an element corresponding to that shown in FIGS. 15 and 16. Further explanation is, therefore, omitted for brevity's sake.

FIG. 18 is a plan view showing an IC device according to the sixth embodiment of the present invention and FIG. 19 is a cross-sectional view as taken along line 19—19 in FIG. 18.

As shown in FIGS. 18 and 19, the IC device of the sixth embodiment is achieved by applying an integral base/drain area of the same impurity concentration in the IC device of the second embodiment to the FET two-input/one-output type Darlington IC device of the fifth embodiment. It is to be noted that the aforementioned integral base/drain area of the same impurity concentration is indicated by a p type semiconductor area 200 in FIGS. 18 and 19.

In the IC device of the sixth embodiment, it is possible to obtain a MOSFET two-input/one-output type BiMOS IC device advantageous to high integration density as well as to obtain a bipolar transistor of high amplification and a highly reliable MOSFET.

Additional advantages and modifications will readily occur to those skilled in the art. Therefore, the invention in its broader aspects is not limited to the specific details, representative devices, and illustrated examples shown and described herein. Accordingly, various modifications may by without departing from the spirit or scope of the general inventive concept as defined by the appended claims and their equivalents.

What is claimed is:

1. A semiconductor integrated device including a bipolar transistor having a base, a first terminal, and a second terminal, and first and second insulated gate field effect transistors (FETs) each having a first terminal, a second terminal, and a gate, said semiconductor integrated device comprising:

a semiconductor body of a first conductivity type having a major surface and functioning as said first terminal of said bipolar transistor;

a first semiconductor region of a second conductivity type formed in said major surface of said semiconductor body and functioning as said first terminal of said first insulate gate FET;

a second semiconductor region of the second conductivity type formed in said major surface of said semiconductor body and functioning as said first terminal of said second insulated gate FET;

a third semiconductor region of the second conductivity type formed in said major surface of said semiconductor body and functioning as said second terminals of said first and second insulated gate FETs and said base of said bipolar transistor;

a fourth semiconductor region of the first conductivity type formed in a surface of said third semiconductor region and functioning as said second terminal of said bipolar transistor;

a first electrode insulatively spaced from a channel area between said first and third semiconductor regions, said first electrode functioning as said gate of said first insulated gate FET and controlling a base current of said bipolar transistor by controlling, in response to input signals, a current flow between said first semiconductor region and said third semiconductor region; and a second electrode electrically connected to said first electrode and insulatively spaced from a channel area between said second and third semiconductor regions, said second electrode functioning as said gate of said second insulated gate FET and controlling the base current by controlling, in response to the input signals, a current flow between said second semiconductor region and said third semiconductor region.

2. The semiconductor integrated device according to claim 1, wherein said semiconductor body and said first and second semiconductor regions are coupled to a power source, said fourth semiconductor region is coupled to an output terminal, and said first and second electrodes are coupled to an input terminal.

3. The semiconductor integrated device according to claim 1, wherein said first and second electrodes are portions of a same conductive member.

4. The semiconductor integrated device according to claim 1, further comprising:
a fifth semiconductor region of the first conductivity type formed in said semiconductor body and having a higher impurity concentration than that of said semiconductor body; and
a sixth semiconductor region of the first conductivity type formed in said major surface of said semiconductor body in contact with said fifth semiconductor region, and having a higher impurity concentration than that of said semiconductor body.

5. The semiconductor integrated device according to claim 4, wherein said fifth and sixth semiconductor regions constitute a portion of said first terminal of said bipolar transistor.

6. The semiconductor integrated device according to claim 1, wherein said third semiconductor region includes first and second portions functioning as said second terminals of said first and second insulated gate FETs, respectively, and a third portion functioning as said base of said bipolar transistor, said first and second portions having a higher impurity concentration than an impurity concentration of said third portion.

7. The semiconductor integrated device according to claim 1, wherein said third semiconductor region has a lower impurity concentration than an impurity concentration of said first and second semiconductor regions.

8. A semiconductor integrated device including a bipolar transistor having a base, a first terminal, and a second terminal, and first and second insulated gate field effect transistors (FETs) each having a first terminal, a second terminal, and a gate, said semiconductor integrated device comprising:
a semiconductor body of a first conductivity type having a major surface and functioning as said first terminal of said bipolar transistor;
a first semiconductor region of a second conductivity type formed in said major surface of said semiconductor body and functioning as said first terminal of said first insulated gate FET;

a second semiconductor region of the second conductivity type formed in said major surface of said semiconductor body spaced from said first semiconductor region and functioning as said first terminal of said second insulated gate FET;

a third semiconductor region of the second conductivity type formed in said major surface of said semiconductor body in the space between said first and second semiconductor regions, said third semiconductor region functioning as said second terminals of said first and second insulated gate FETs and said base of said bipolar transistor;

a fourth semiconductor region of the first conductivity type formed in a surface of said third semiconductor region and functioning as said second terminal of said bipolar transistor;

a first electrode insulatively spaced from a channel area between said first and third semiconductor region, said first electrode functioning as said gate of said first insulated gate FET and controlling a base current of said bipolar transistor by controlling, in response to first input signals, a current flow from said first semiconductor region to said third semiconductor region; and a second electrode insulatively spaced from a channel area between said second and third semiconductor regions, said second electrode functioning as said gate of said second insulated gate FET and controlling the base current by controlling, in response to second input signals, a current flow from said second semiconductor region to said third semiconductor region.

9. The semiconductor integrated device according to claim 8, wherein said semiconductor body and said first and second semiconductor regions are coupled to a power source, said fourth semiconductor region is coupled to an output terminal, and said first and second electrodes are respectively coupled to first and second input terminals.

10. The semiconductor integrated device according to claim 8, further comprising:
a fifth semiconductor region of the first conductivity type formed in said semiconductor body and having a higher impurity concentration than an impurity concentration of said semiconductor body; and
a sixth semiconductor region of the first conductivity type formed in said major surface of said semiconductor body in contact with said fifth semiconductor region, and having a higher impurity concentration than the impurity concentration of said semiconductor body.

11. The semiconductor integrated device according to claim 10, wherein said fifth and sixth semiconductor regions comprise a portion of said first terminal of said bipolar transistor.

12. The semiconductor integrated device according to claim 8, wherein said third semiconductor region includes first and second portions functioning as said second terminals of said first and second insulated gate FETS, respectively, and a third portion functioning as said base of said bipolar transistor, said first and second portion having a higher impurity concentration than an impurity concentration of said third portion.

13. The semiconductor integrated device according to claim 8, wherein said third semiconductor region has a lower impurity concentration than an impurity concentration of said first and second semiconductor regions.

14. The semiconductor integrated device according to claim 1, wherein said third semiconductor region is formed in said major surface of said semiconductor body between said first and second electrodes.

15. The semiconductor integrated device according to claim 1, said first terminal of said bipolar transistor is a collector, said second terminal of said bipolar transistor is an emitter, said first terminals of said first and second insulated gate FETs are sources, and said second terminals of said first and second insulated gate FETs are drains.

16. The semiconductor integrated device according to claim 1, wherein said first and second insulated gate FETs are MOSFETs.

17. The semiconductor integrated device according to claim 8, said first terminal of said bipolar transistor is a collector, said second terminal of said bipolar transistor is an emitter, said first terminals of said first and second insulated gate FETs are sources, and said second terminals of said first and second insulated gate FETs are drains.

18. The semiconductor integrated device according to claim 8, wherein said first and second insulated gate FETs are MOSFETs.

19. A semiconductor integrated device including a bipolar transistor having a base, a first terminal, and a second terminal and first and second insulated gate field effect transistors (FETs) each having a first terminal, a second terminal, and a gate, said semiconductor integrated device comprising:
   a semiconductor body of a first conductivity type having a major surface and functioning as said first terminal of said bipolar transistor;
   a first semiconductor region of a second conductivity type formed in said major surface of said semiconductor body and functioning as said first terminal of said first insulated gate FET;
   a second semiconductor region of the second conductivity type formed in said major surface of said semiconductor body and functioning as said first terminal of said second insulated gate FET;
   a third semiconductor region of the second conductivity type formed in said major surface of said semiconductor body and functioning as said second terminals of said first and second insulated gate FETs and said base of said bipolar transistor;
   a fourth semiconductor region of the first conductivity type formed in a surface of said third semiconductor region and functioning as said second terminal of said bipolar transistor;
   a first electrode insulatively spaced from a channel area between said first and third semiconductor regions, said first electrode functioning as said gate of said first insulated gate FET and controlling a base current of said bipolar transistor by controlling, in response to input signals, a current flow between said first semiconductor region and said third semiconductor region;
   a second electrode insulatively spaced from a channel area between said second and third semiconductor regions, said second electrode functioning as sat gate of said second insulated gate FET and controlling the base current by controlling, in response to the input signals, a current flow between said second semiconductor region and said third semiconductor region; and
   means for maintaining said second electrode at an electric potential corresponding to an electric potential of said first electrode.

20. The semiconductor integrated device according to claim 19, wherein said means for maintaining comprises a gate connection portion electrically connecting said first electrode and said second electrode to maintain said second electrode at the same electric potential as said first electrode.

21. A semiconductor integrated device including a bipolar transistor having a base, a first terminal, and a second terminal, and an insulated gate field effect transistor (FET) having a first terminal, a second terminal, and a gate, said semiconductor integrated device comprising:
   a semiconductor body of a first conductivity type having a major surface and functioning as said first terminal of said bipolar transistor;
   a first semiconductor region of a second conductivity type formed in said major surface of said semiconductor body and functioning as said first terminal of said insulated gate FET, said first semiconductor region including a first portion and a second portion extending at an angle from said first portion;
   a second semiconductor region of the second conductivity type formed in said major surface of said semiconductor body, said second semiconductor region functioning as said second terminal of said insulated gate FET and said base of said bipolar transistor;
   a third semiconductor region of the first conductivity type formed in a surface of said second semiconductor region and functioning as said second terminal of said bipolar transistor; and
   an electrode, insulatively spaced from a channel area between said first and second semiconductor regions, said electrode functioning as the gate of said insulated gate FET and controlling the base current by controlling, in response to input signals, a current flow from said first and second portions of said first semiconductor region to said second semiconductor region.

22. The semiconductor integrated device according to claim 21, wherein said first semiconductor region further includes a third portion extending at an angle with said second portion and said electrode controls, in response to the input signals, a current flow from said first, second, and third portions of said first semiconductor region of said second semiconductor region.

23. The semiconductor integrated device according to claim 22, wherein said second portion is perpendicular to said first portion and said third portion is perpendicular to said second portion such that said first semiconductor region is U-shaped.

24. The semiconductor integrated device according to claim 21, wherein said first terminal of said bipolar transistor is a collector, said second terminal of said bipolar transistor is an emitter, said first terminal of said insulated gate FET is a source, and said second terminal of said insulated gate FET is a drain.

25. The semiconductor integrated device according to claim 21, wherein said third semiconductor region includes a first portion functioning as said second terminal of said insulated gate FETS and a second portion functioning as said base of said bipolar transistor, said first portion having a higher impurity concentration than an impurity concentration of said second portion.

* * * * *